(12) United States Patent
Kang et al.

(10) Patent No.: US 7,741,646 B2
(45) Date of Patent: Jun. 22, 2010

(54) LIQUID CRYSTAL DISPLAY DEVICE AND FABRICATING METHOD THEREOF

(75) Inventors: Hee Kwang Kang, Seoul (KR); Kyo Seop Choo, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 733 days.

(21) Appl. No.: 11/451,418

(22) Filed: Jun. 13, 2006

(65) Prior Publication Data

US 2007/0131936 A1 Jun. 14, 2007

(30) Foreign Application Priority Data

Dec. 14, 2005 (KR) .......................... 2005-0123301

(51) Int. Cl.
*H01L 29/04* (2006.01)

(52) U.S. Cl. .................... 257/72; 257/223; 257/227; 257/291; 257/292; 257/439; 257/655; 257/E27.1; 257/E27.125; 257/E27.112; 257/E29.145; 257/E29.147; 257/E29.151

(58) Field of Classification Search ................ 257/223, 257/227, 291, 292, 439, 655, 72, E27.1, E27.125, 257/E27.112, E29.145, E29.151, E29.147
See application file for complete search history.

(56) References Cited

U.S. PATENT DOCUMENTS

| 6,947,102 | B2 | 9/2005 | den Boer et al. | |
|---|---|---|---|---|
| 2003/0174256 | A1 | 9/2003 | Kim et al. | |
| 2004/0201786 | A1 | 10/2004 | Park et al. | |
| 2005/0117079 | A1* | 6/2005 | Pak et al. | 349/43 |
| 2006/0109222 | A1* | 5/2006 | Lee et al. | 345/88 |
| 2007/0296685 | A1* | 12/2007 | Kang et al. | 345/102 |

* cited by examiner

*Primary Examiner*—Wael Fahmy
*Assistant Examiner*—Marc Armand
(74) *Attorney, Agent, or Firm*—McKenna Long & Aldridge

(57) ABSTRACT

A liquid crystal display panel and a fabricating method thereof comprising an image sensing capability, image scanning, and touch inputting. In the liquid crystal display device, a gate line and a data line are formed to intersect each other on a substrate to define a pixel area in which a pixel electrode is positioned. A first thin film transistor is positioned at an intersection area of the gate line and the data line. A sensor thin film transistor senses light having image information and supplied with a first driving voltage from the data line. A driving voltage supply line is positioned in parallel to the gate line to supply a second driving voltage to the sensor thin film transistor.

7 Claims, 24 Drawing Sheets

FIG.8A
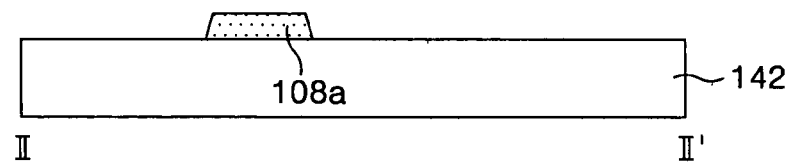
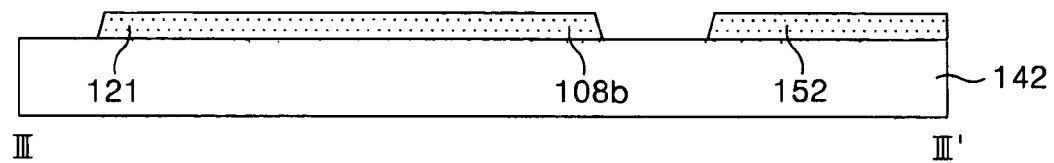
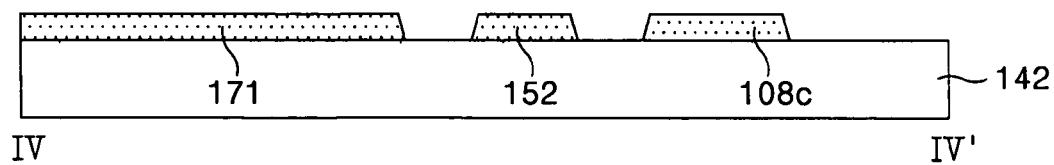

FIG.8B
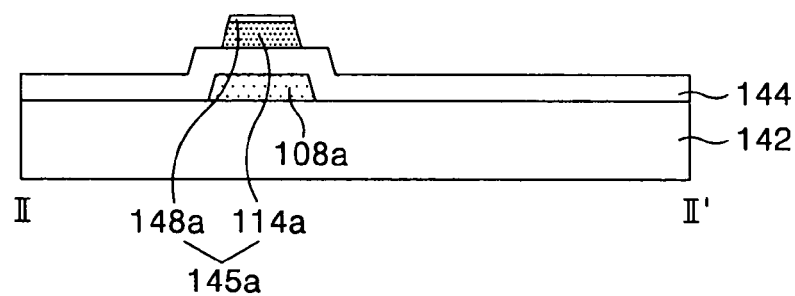
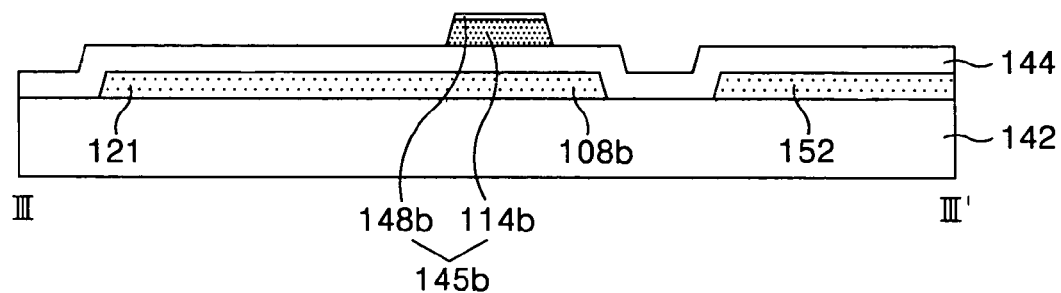
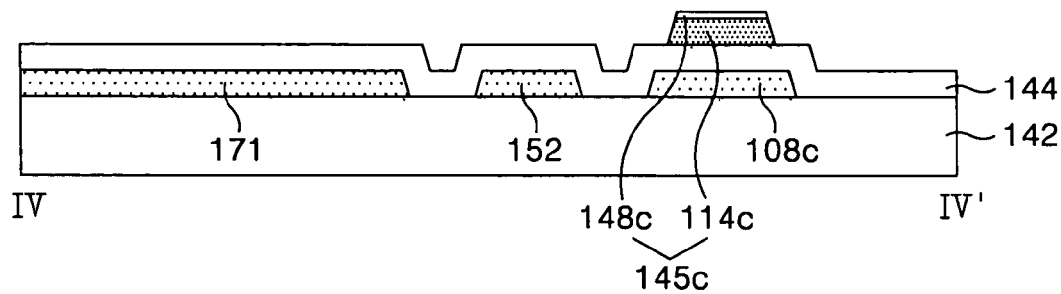

FIG.8C
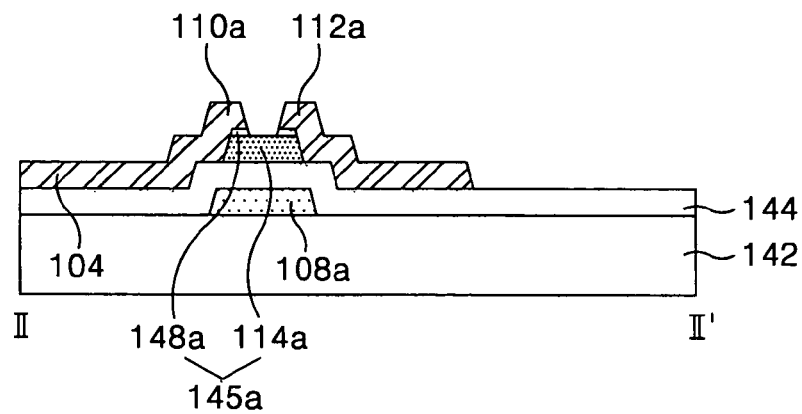
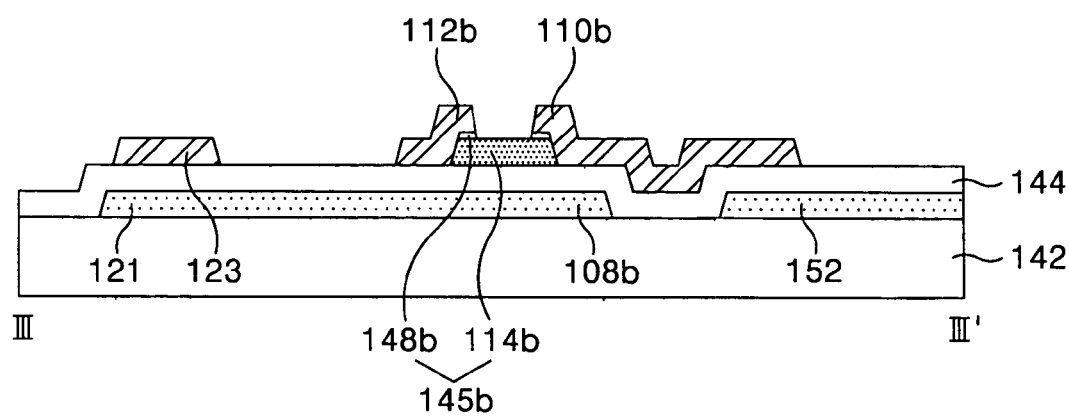
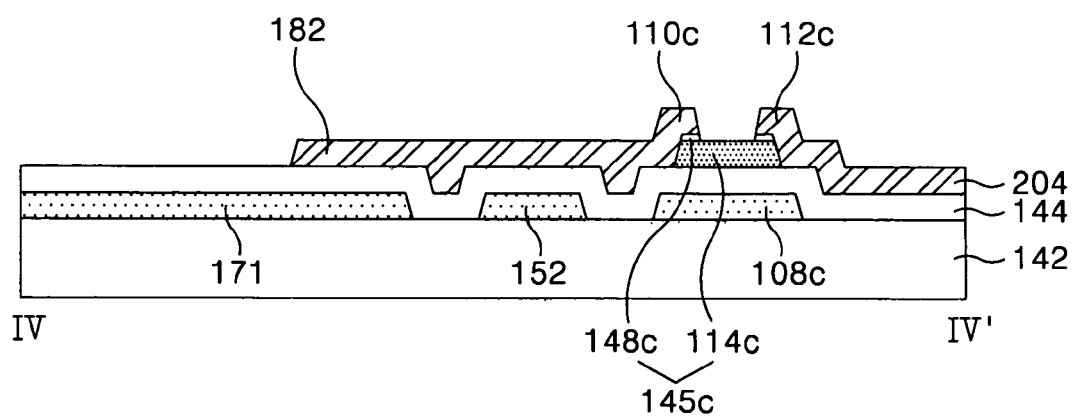

FIG.15A
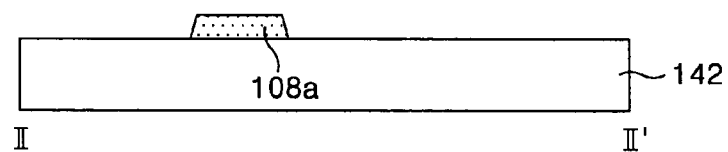
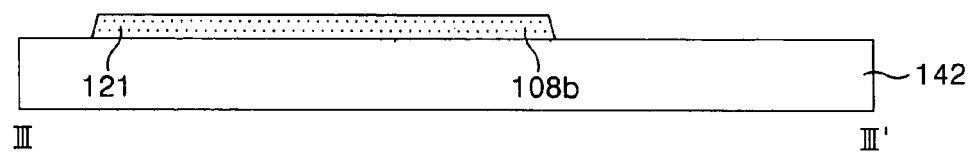
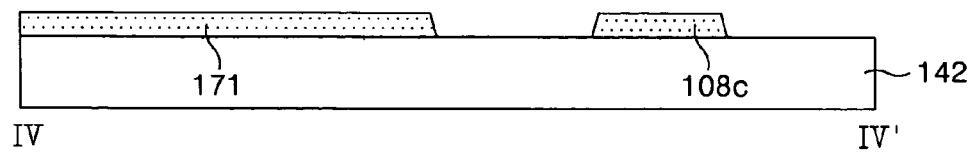

FIG.15B
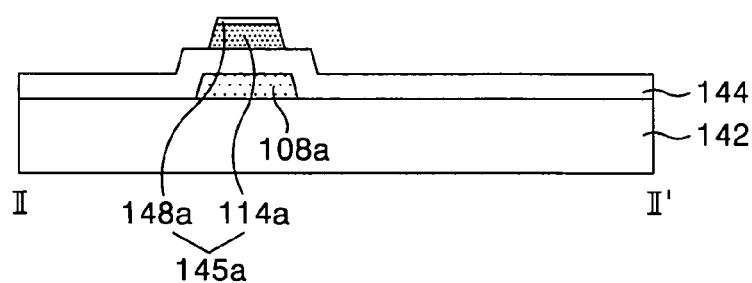
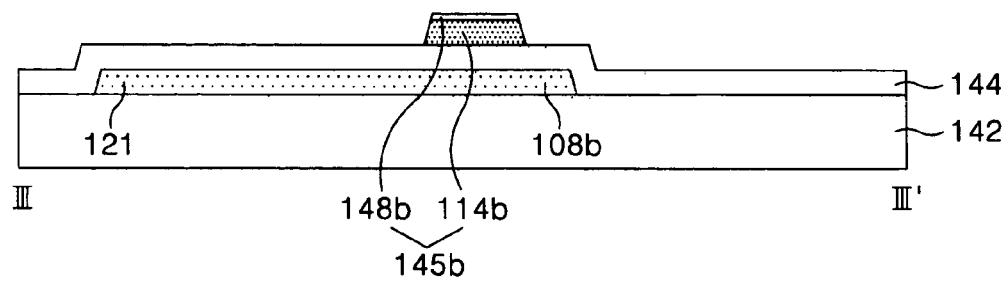
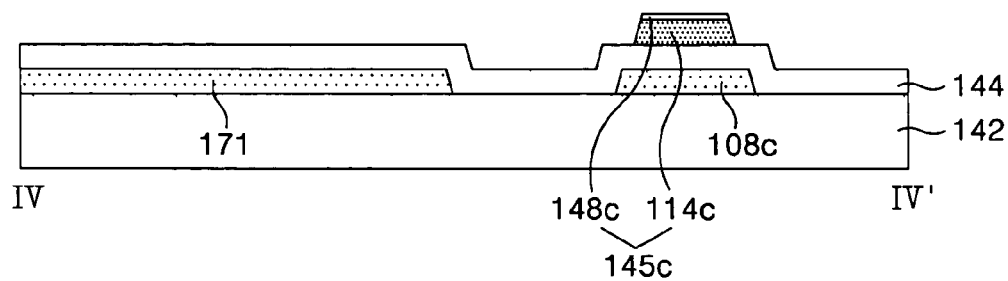

FIG.15C
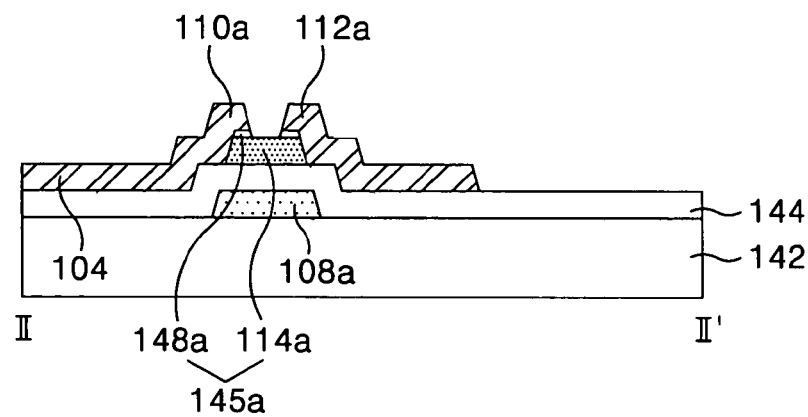
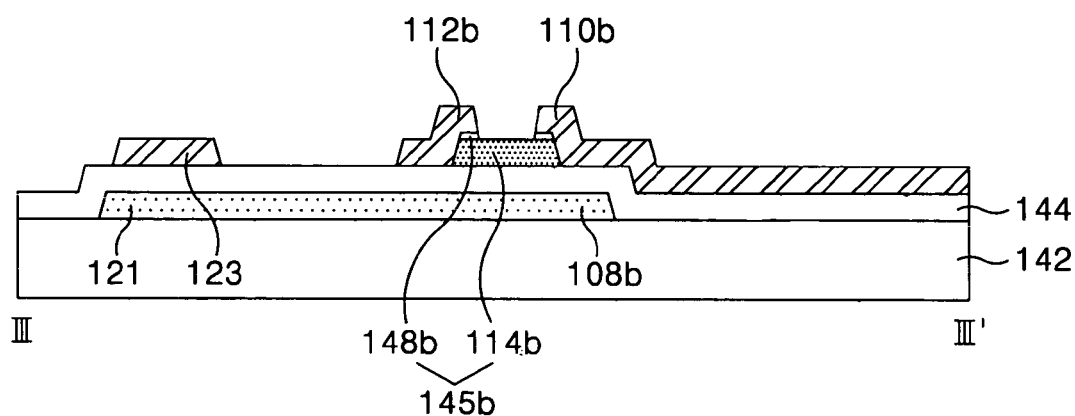
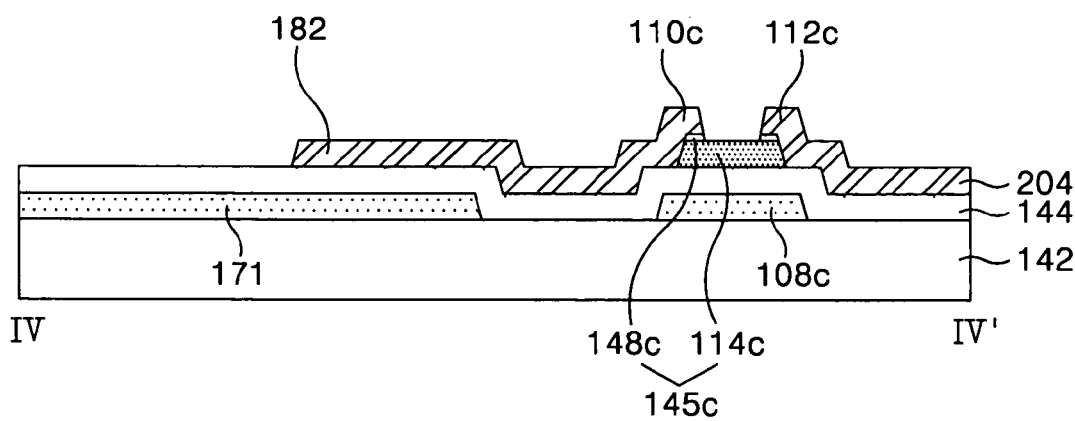

LIQUID CRYSTAL DISPLAY DEVICE AND FABRICATING METHOD THEREOF

This application claims the benefit of Korean Patent Application No. P2005-0123301 filed in Korea on Dec. 14, 2005, which is hereby incorporated by reference for all purposes as if fully set forth herein.

BACKGROUND OF THE INVENTION

1. Field of the Invention

The present invention relates to a liquid crystal display device, and more particularly, to a liquid crystal display device and a fabricating method thereof having an image sensing function adapted for scanning a document and image and touch-inputting, and a method of sensing an image by using the liquid crystal display device and the associated fabricating method.

2. Description of the Related Art

A liquid crystal display device controls light transmittance of liquid crystal using an electric field in order to display a picture. To this end, the liquid crystal display device includes a liquid crystal display panel having liquid crystal cells arranged in a matrix, and a driving circuit for driving the liquid crystal display panel.

The liquid crystal display panel may include a thin film transistor array substrate and a color filter array substrate opposed to each other, liquid crystal injected between the two substrates, and may include a spacer to maintain cell gap between the two substrates.

The thin film transistor array substrate includes gate lines, data lines, thin film transistors as switching devices at each intersection between the gate lines and the data lines, pixel electrodes formed for each liquid crystal cell and connected to the thin film transistor, and alignment films. The gate lines and the data lines receive signals from the driving circuits via each pad portion. The thin film transistor applies a pixel signal fed to the data line to the pixel electrode in response to a scanning signal fed to the gate line.

The color filter array substrate includes color filters for each liquid crystal cell, black matrices between the color filters, common electrodes for commonly applying reference voltages to the liquid crystal cells, and an alignment film.

The liquid crystal display panel is completed by preparing the array substrate and the color filter substrate individually, joining them, and then injecting liquid crystal between the substrates. The substrates are then sealed with an appropriate sealant.

FIG. 1 is a plan view illustrating a thin film transistor array substrate of a related art liquid crystal display device, and FIG. 2 is a sectional view of the thin film transistor array substrate taken along the line I-I' of FIG. 1.

Referring to FIG. 1 and FIG. 2, the thin film transistor array substrate includes a gate line 2 and a data line 4 provided on a lower substrate 42 such that they intersect each other with a gate insulating film 44 therebetween, a thin film transistor 6 (hereinafter, referred to as "TFT") provided at each intersection, and a pixel electrode 18 provided as shown. Further, the thin film transistor array substrate includes a storage capacitor 20 provided at an overlapped portion between the pixel electrode 18 and the gate line 2.

The TFT 6 includes a gate electrode 8 connected to the gate line 2, a source electrode 10 connected to the data line 4, a drain electrode 12 connected to the pixel electrode 18, and an active layer 14 overlapping with the gate electrode 8 and defining a channel between the source electrode 10 and the drain electrode 12. An ohmic contact layer 48 for making an ohmic contact with the data line 4, the source electrode 10 and the drain electrode 12 is further formed on the active layer 14. The active layer 14 and the ohmic contact layer 48 form a semiconductor 45.

The TFT 6 allows a pixel voltage signal applied to the data line 4 to be charged into the pixel electrode 18 and kept in response to a gate signal applied to the gate line 2.

The pixel electrode 18 is connected to the drain 12 of the TFT 6 by a contact hole 16 through a protective film 50. The pixel electrode 18 contributes to a potential difference with respect to a common electrode provided at an upper substrate (not shown). This potential difference rotates liquid crystal molecules positioned between the thin film transistor array substrate and the upper substrate because of dielectric anisotropy and transmits light via the pixel electrode 18 from a light source (not shown) toward the upper substrate.

The storage capacitor 20 is formed by the overlap of the gate line 2 and the pixel electrode 18. A gate insulating film 44 and a protective film 50 are positioned between the gate line 2 and the pixel electrode 18. The storage capacitor 20 allows a pixel voltage charged in the pixel electrode 18 to be stably maintained until the next pixel voltage is charged.

The related art liquid crystal display device only has display capability but does not have sensing capability or external image display capability.

FIG. 3 is a cross section showing a related art image sensing device. The TFT structure of related art FIG. 1 and FIG. 2 is given the same reference numbers as in related art FIG. 3.

Referring to FIG. 3, an image sensing device includes a photo TFT 40, a storage capacitor 80 connected to both the photo TFT 40 and a switching TFT 6 located opposite the photo TFT 40 and having a storage capacitor 80 therebetween.

The photo TFT 40 includes a gate electrode 8 formed on the substrate 42, an active layer 14 overlapping the gate electrode 8 having the gate insulating film 44 therebetween, a source electrode 60 electrically connected to the active layer 14, and a drain electrode 62 opposed to the source electrode 60. The active layer 14 overlaps with the source electrode 60 and the drain electrode 62, and further includes a channel portion between the source electrode 60 and the drain electrode 62. The ohmic contact layer 48, for ohmic contact with the source electrode 60 and the drain electrode 62, is further formed on the active layer 14. The photo TFT 40 senses light transmitted by an image such as a document or a fingerprint.

The storage capacitor 80 overlaps with a lower storage electrode 72 where the lower storage electrode 72 is connected to the gate electrode 8 of the photo TFT 40, with the insulating film 44 therebetween, and includes an upper storage electrode 74 connected to the drain electrode 62 of the photo TFT 40. The storage capacitor 80 stores an electric charge by a photo current generated at the photo TFT 40.

The switching TFT 6 includes a gate electrode 8 formed on the substrate 42, a source electrode 10 connected to the upper storage electrode 74, a drain electrode 12 opposite the source electrode 10, and an active layer 14 overlapping the gate electrode 8 with a channel between the source electrode 10 and the drain electrode 12. The active layer 14 overlaps with the source electrode 10 and the drain electrode 12, and further includes a channel portion between the source electrode 10 and the drain electrode 12.

An ohmic contact layer 48 for ohmic contact with the source electrode 10 and the drain electrode 12 is further formed on the active layer 14.

Driving of the image sensing device with the above structure will be briefly described. For example, approximately 10V is applied to the source electrode 60 of the photo TFT 40, and approximately −5V of an inverse bias voltage is applied to the gate electrode 8. When light is sensed by the active layer 14, a photo current path in the drain electrode 62 and source electrode 60 channel is generated. The photo current path flows from the drain electrode 62 into the upper storage electrode 74, and the lower storage electrode 72 is connected to the gate electrode 8 of the photo TFT 40, so that an electric charge generated by the photo current is charged into the storage capacitor 80. The electric charge charged into the storage capacitor 80 is transmitted into the switching TFT 6 to create an image sensed by the photo TFT 40.

Accordingly, a related art liquid crystal display device has only display capability, and a related art image sensing device only has image sensing capability.

SUMMARY OF THE INVENTION

Accordingly, the present invention is directed to a liquid crystal display device and a fabricating method thereof having document and fingerprint sensing capability, for example, and for displaying an image on a picture, and a method of sensing an image by using the liquid crystal display device and the fabricating method thereof that substantially obviates one or more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device comprises a gate line and a data line intersecting each other on a substrate to define a pixel area in which a pixel electrode is positioned; a first thin film transistor positioned at an intersection area of the gate line and the data line; a sensor thin film transistor that senses light having an image information and supplied with a first driving voltage from the data line; and a driving voltage supply line positioned in parallel to the gate line to supply a second driving voltage to the sensor thin film transistor.

The liquid crystal display device may include a first storage capacitor for storing a pixel voltage charged into the pixel electrode; a second storage capacitor for storing a signal sensed by the sensor thin film transistor; an integrated circuit for extracting the sensing signal stored in the second storage capacitor; a second thin film transistor connected to the second storage capacitor and the gate line, and for selectively supplying the sensing signal to the integrated circuit; and a sensing signal transmitting line positioned in parallel to the data line with having the pixel area therebetween, and for transmitting a sensing signal from the second thin film transistor into the integrated circuit.

The sensor thin film transistor may include a first gate electrode extended from the driving voltage supply line; a gate insulating film to cover the first gate electrode; a first semiconductor pattern overlapped with the first gate electrode and having the gate insulating film therebetween; a first source electrode contacted with the first semiconductor pattern, and connected to the data line; and a first drain electrode opposite to the first source electrode.

The first drain electrode may include a "U" shape.

The first storage capacitor may include a first lower storage electrode extended from the driving voltage supply line; and a first upper storage electrode overlapped with the first lower storage electrode having the gate insulating film therebetween, wherein the first upper storage electrode is contacted, via a first hole passing through a protective film, with the pixel electrode.

The second storage capacitor may include a second-one storage capacitor consisted of a second storage electrode contacted with a first drain electrode of the sensor thin film transistor and the second thin film transistor, and the driving voltage supply line overlapped with the second storage electrode having the gate insulating film therebetween; and a second-two storage capacitor overlapped with the second storage electrode having a protective film therebetween, and consisting of a transparent electrode contacted, via a second hole for exposing the driving voltage supply line, with the driving voltage supply line.

The second thin film transistor may include a second gate electrode contacted with the pre-stage gate line; a second semiconductor pattern overlapped with the second gate electrode having the gate insulating film therebetween; a second source electrode electrically connected to the second semiconductor pattern, and extended from the second storage electrode; and a second drain electrode opposed to the second source electrode, and connected to the sensing signal transmitting line.

The first thin film transistor may include a third gate electrode extended from the gate line; a third semiconductor pattern formed in such a manner to overlap with the third gate electrode with having the gate insulating film therebetween; a third source electrode electrically connected to the third semiconductor pattern, and extended from the data line; and a third drain electrode opposed to the third source electrode, and connected to the pixel electrode.

In another aspect of the present invention, a method of fabricating a liquid crystal display device comprises the steps of forming a gate pattern including a gate line, a first gate electrode of a sensor thin film transistor, a second gate electrode of a first thin film transistor, and a third gate electrode of a second thin film transistor on a first substrate; forming a gate insulating film on a substrate provided with the gate pattern; forming a first semiconductor pattern overlapped with the first gate electrode, a second semiconductor pattern overlapped with the second gate electrode, and a third semiconductor pattern overlapped with the third gate electrode on the gate insulating film; forming a source/drain pattern including a data line crossing the gate line, a first source electrode and a first drain electrode connected to a first semiconductor pattern, and positioned in such a manner to oppose to each other, a second source electrode and a second drain electrode connected to a second semiconductor pattern, and positioned in such a manner to oppose to each other, and a third source electrode and a third drain electrode connected to a third semiconductor pattern, and positioned in such a manner to oppose to each other with having the gate insulating film therebetween to provide a sensor thin film transistor, and a first and second thin film transistors; forming a protective film having a first hole for exposing the second drain electrode of the first thin film transistor; and forming a pixel electrode connected, via the first hole, to the second drain electrode, wherein the first source electrode of the sensor thin film transistor and the second source electrode of the first thin film transistor are connected to the data line, respectively.

The step of forming the gate pattern may include forming a driving voltage supply line formed in parallel to the gate line to supply a driving voltage to the sensor thin film transistor, and forming a first lower storage electrode in parallel to the gate line and extended from the driving voltage supply line.

The step of forming the source/drain pattern may include forming a first upper storage electrode to overlap with the first lower storage electrode having the gate insulating film therebetween to consist of the first lower storage electrode and the first storage capacitor.

The method of fabricating the liquid crystal display device may further comprise forming a second storage capacitor for storing a signal sensed by the sensor thin film transistor, the step of forming the second storage capacitor may include forming a second-one storage capacitor including a second storage electrode positioned between the first drain electrode of the sensor thin film transistor and the second source electrode of the second thin film transistor, and the driving voltage supply line overlapped with the second storage electrode with having the gate insulating film; and forming a second-two storage capacitor overlapped with the second storage electrode having the second storage electrode and the protective film therebetween, and including a transparent electrode contacted, via a second hole for exposing the second driving voltage supply line, with the second driving voltage supply line.

The step of forming the source/drain pattern may include forming a sensing signal transmitting line positioned in parallel to the data line and connected to the third drain electrode of the second thin film transistor.

The method of fabricating the liquid crystal display device may comprise preparing a second substrate positioned with the first substrate and the liquid crystal layer; forming a black matrix for segmenting a cell area and preventing light leakage on the second substrate; and forming a color filter at a cell area segmented by the black matrix.

The black matrix may be formed at an area except for a pixel area corresponding to the pixel electrode and a light receiving area for receiving light in the sensor thin film transistor.

In another aspect of the present invention, the liquid crystal display device comprising the thin film transistor array substrate and the color filter array substrate joined to each other with the liquid crystal layer therebetween, the thin film transistor array substrate comprises a gate line and a data line intersecting each other on a substrate to define a pixel area in which a pixel electrode is positioned; a first thin film transistor at an intersection area of the gate line and the data line; a sensor thin film transistor that senses light having an image information and supplied with a first driving voltage from the data line; a driving voltage supply line in parallel to the gate line to supply a second driving voltage to the sensor thin film transistor; a first storage capacitor for storing a pixel voltage charged into the pixel electrode; a second storage capacitor for storing a signal sensed by the sensor thin film transistor; an integrated circuit for extracting the sensing signal stored in the second storage capacitor; a second thin film transistor connected to the second storage capacitor and the pre-stage gate line, and for selectively supplying the sensing signal to the integrated circuit; and a sensing signal transmitting line positioned in parallel to the data line having the pixel area therebetween, and for transmitting a sensing signal from the second thin film transistor into the integrated circuit.

The color filter array substrate may include a black matrix for segmenting a cell area on the second substrate and for preventing light leakage; and a color filter formed at a cell area segmented by the black matrix.

The black matrix may be formed at an area except for the pixel area corresponding to the pixel electrode and a light receiving area for receiving light in the sensor thin film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 8A to FIG. 8E are steps for explaining a method of fabricating a thin film transistor array substrate having image sensing capability according to an embodiment of the present invention;

FIGS. 15A to FIG. 15E are steps for explaining a method of fabricating a thin film transistor array substrate having image sensing capability according to an embodiment of the present invention.

DETAILED DESCRIPTION OF THE ILLUSTRATED EMBODIMENTS

Hereinafter, the embodiments of the present invention will be described in detail with reference to FIG. 4 to FIG. 16.

Figure 1:
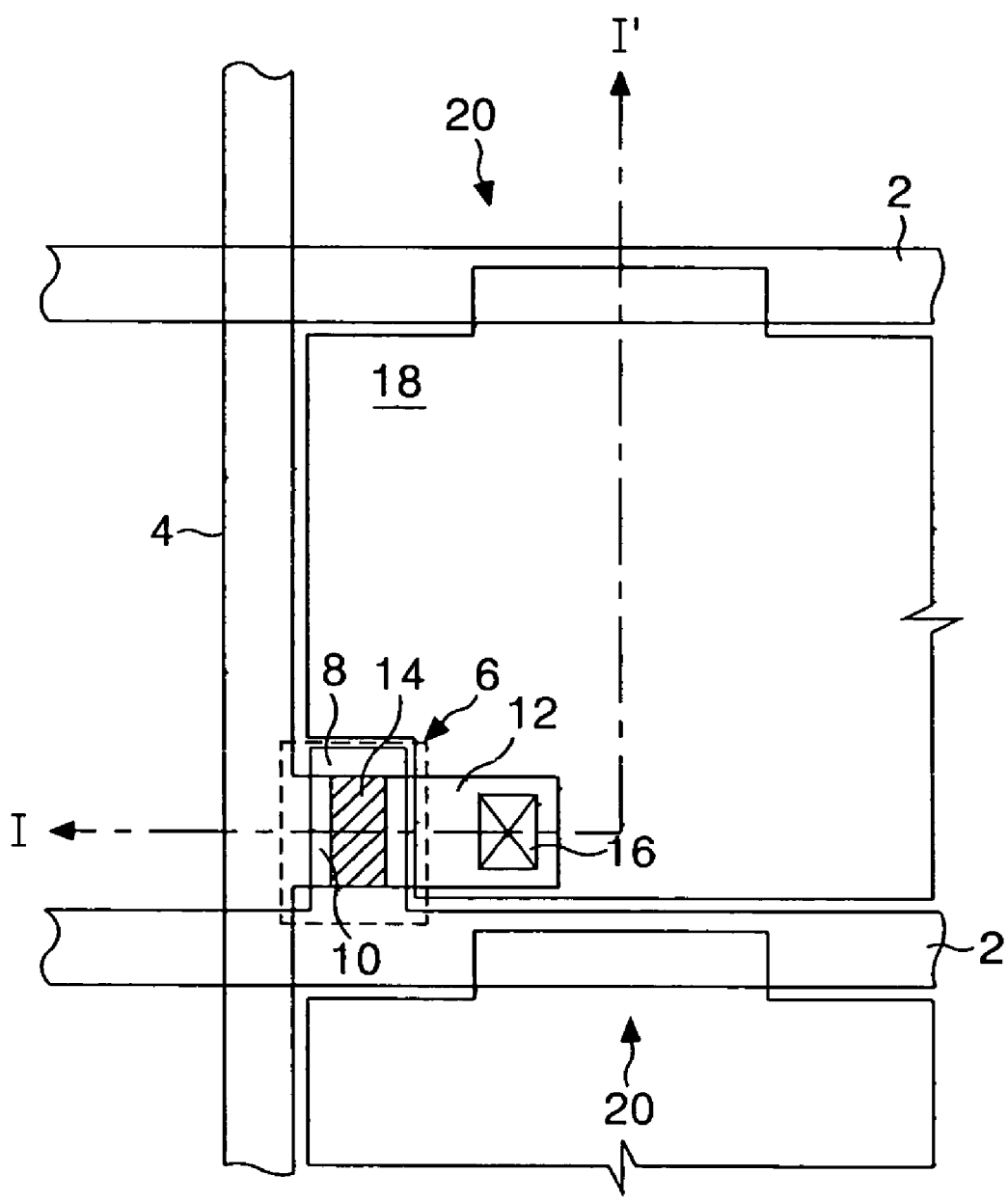
FIG. 1 is a plan view showing a portion of a related art TFT array substrate.
Figure 2:
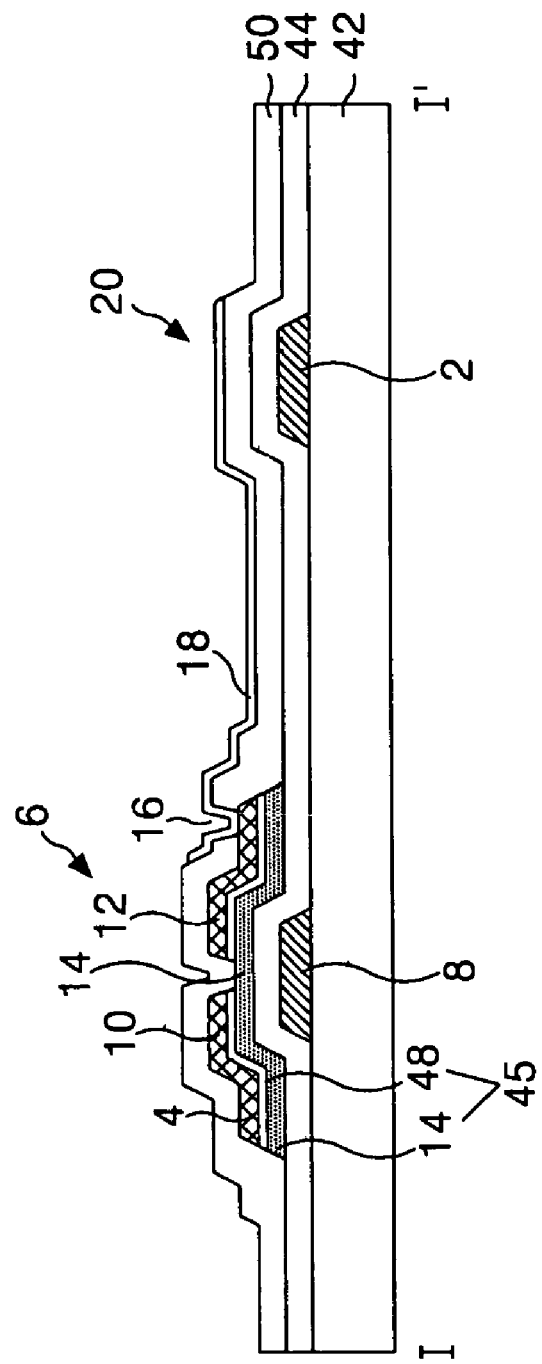
FIG. 2 is a sectional view of the TFT array substrate taken along the I-I' line in FIG. 1.
Figure 3:
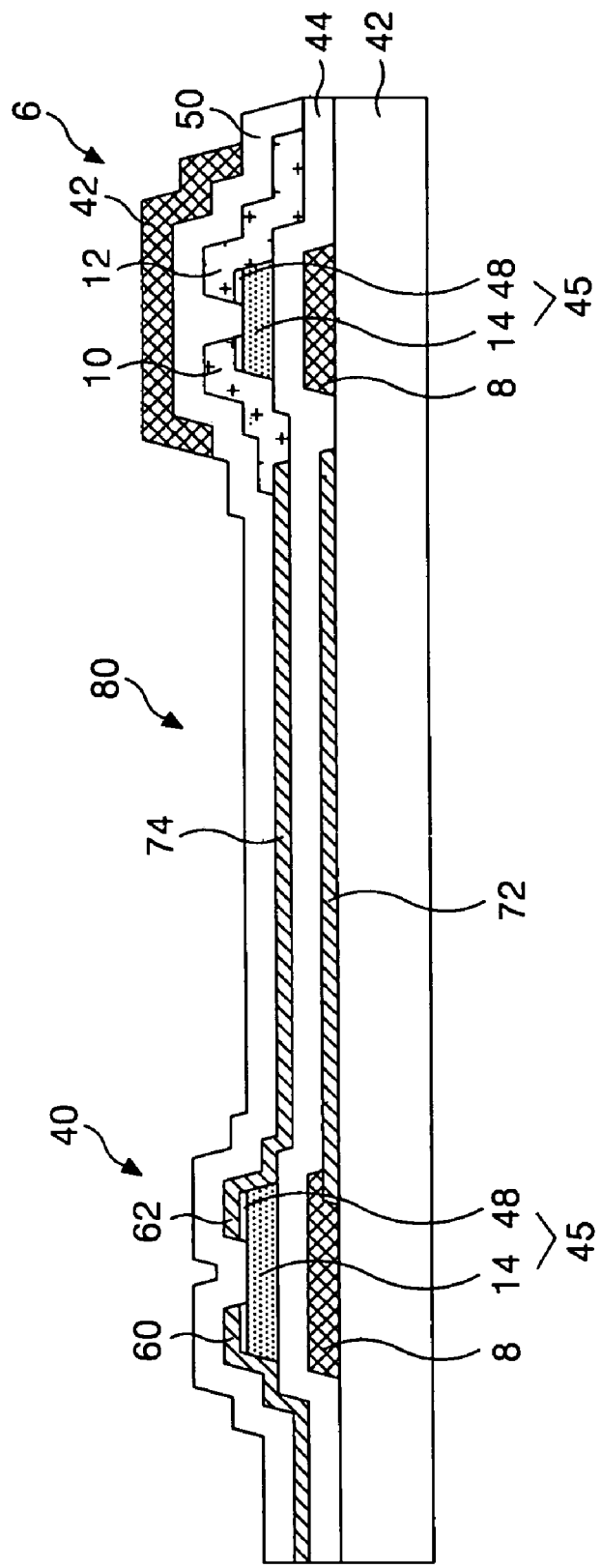
FIG. 3 is a sectional view showing a related art photo sensing device.
Figure 4:
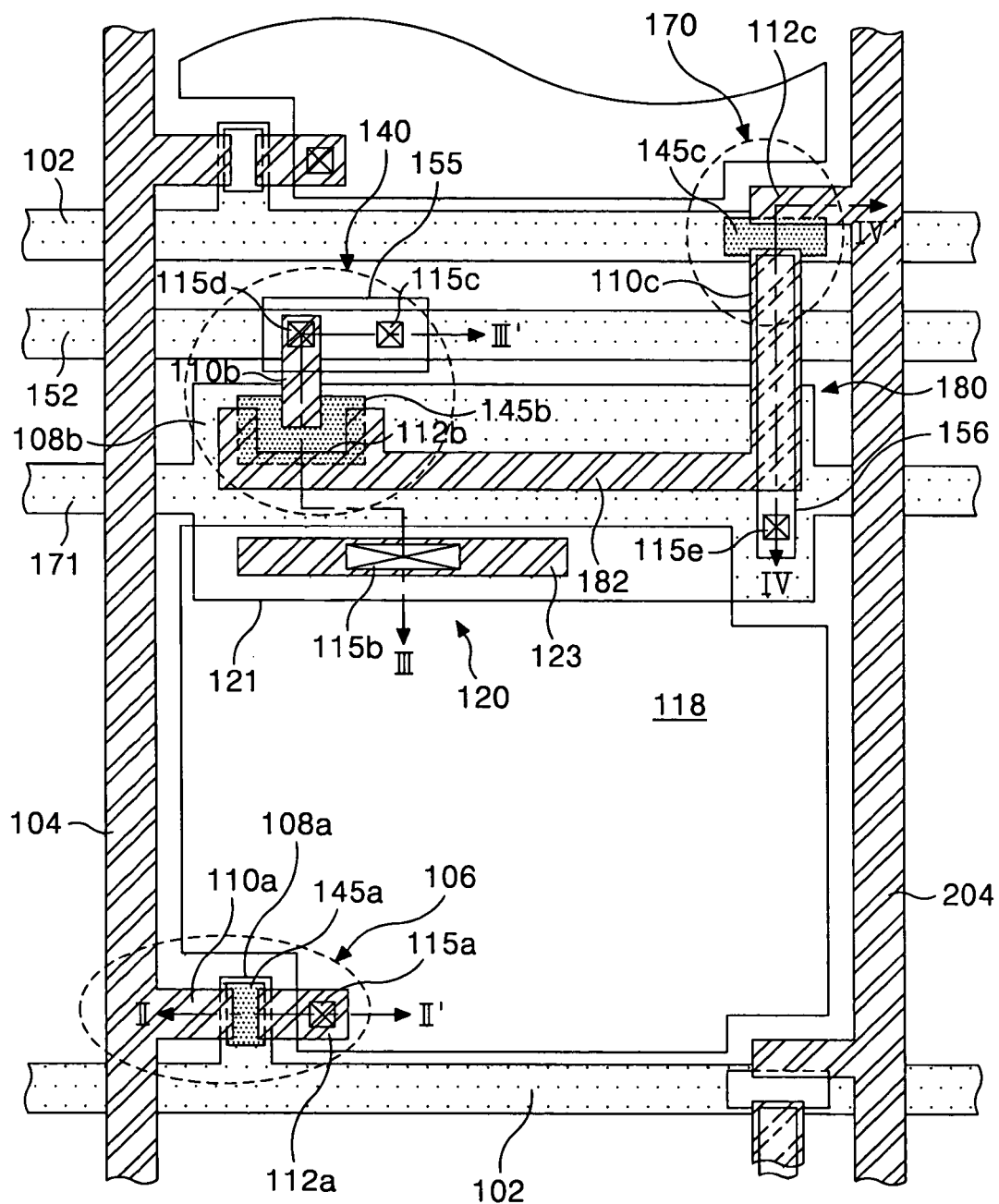
FIG. 4 is a plan view showing a thin film transistor array substrate of a liquid crystal display device having image sensing capability according to an embodiment of the present invention.
Figure 5:
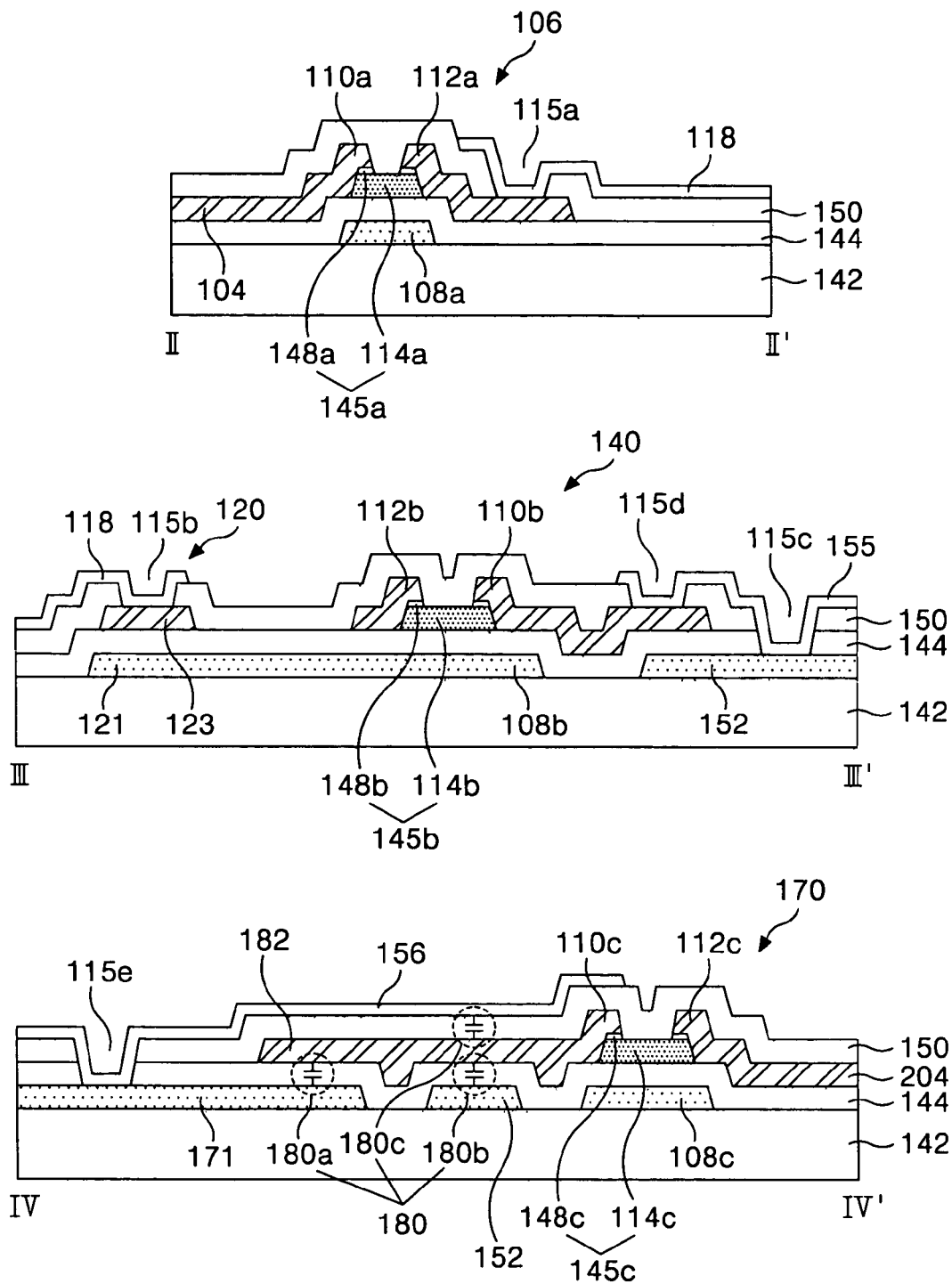
FIG. 5 are sectional views of the thin film transistor array substrate taken along the lines II-II', III-III', IV-IV' of FIG. 4.

FIG. 4 is a plan view showing a thin film transistor array substrate of a liquid crystal display device having image sensing capability according to an embodiment of the present invention, and FIG. 5 is a sectional view of the thin film transistor array substrate taken along the lines II-II', III-III', IV-IV' of FIG. 4.

Referring to FIG. 4 and FIG. 5, the thin film transistor array substrate includes a gate line 102 and a data line 104 intersecting each other on a lower substrate 142, a pixel switching TFT 106 (hereinafter, referred to as "first TFT") formed at an intersection thereof, a pixel electrode 118 provided for each cell area defined by an intersection structure, a Read-Out Line 204 formed substantially in parallel to the data line 104 with having the pixel electrode 118, a first and second driving voltage supply line 152 and 171 formed substantially in parallel to the gate line 102, a sensor TFT 140 substantially positioned between the first and second driving voltage supply line 152 and 171, and supplied with a first and second driving voltage from the first and second driving voltage supply line 152 and 171, a switching TFT 170 (hereinafter, referred to as "second TFT") formed at an intersection area of the gate line 102 and the Read-Out Line 204, a pixel data storage capacitor 120 (hereinafter, referred to as "first storage capacitor") formed at an overlapping portion of the second driving voltage supply line 171 and the pixel electrode 118, and a sensing signal storage capacitor 180 (hereinafter, referred to as "second storage capacitor") substantially positioned between the second TFT 170 and the sensor TFT 140.

The first TFT 106 includes a gate electrode 108a connected to the gate line 102, a source electrode 110a connected to the data line 104, a drain electrode 112a connected to the pixel electrode 118, and an active layer 114a overlapping the gate electrode 108a and forming a channel between the source electrode 110a and the drain electrode 112a. The active layer 114a partially overlaps with the source electrode 110a and the drain electrode 112a, and further includes a channel portion between the source electrode 110a and the drain electrode 112a. An ohmic contact layer 148a for ohmic contact with the source electrode 110a and the drain electrode 112a is further formed on the active layer 114a. Herein, the active layer 114a and the ohmic contact layer 148a constitute a semiconductor pattern 145a.

The first TFT 106 allows a pixel voltage signal applied to the data line 104 to be charged into the pixel electrode 118 and kept in response to a gate signal applied to the gate line 102.

The pixel electrode 118 is connected, via a first contact hole 115a passing through a protective film 150, to the drain electrode 112a of the first TFT 106. The pixel electrode 118 generates a potential difference with respect to a common electrode provided at an upper substrate (not shown) (for example, a color filter array substrate) by the charged pixel voltage signal. This potential difference rotates liquid crystal molecules positioned between the TFT array substrate and the upper substrate because of a dielectric anisotropy and transmits light, via the pixel electrode 118, from a light source (not shown) toward the upper substrate.

The first storage capacitor 120 includes a first lower storage electrode 121 extended from the second driving voltage supply line 171, and the first upper storage electrode 123 substantially overlapped with the first lower storage electrode 121 having the gate insulating film 144 therebetween. The first upper storage electrode 123 passes through the protective film 150 to contact with the pixel electrode 118 via a second contact hole 115b.

The first storage capacitor 120 allows a pixel voltage charged in the pixel electrode 118 to be stably maintained until the next pixel voltage is charged.

The sensor TFT 140 includes a gate electrode 108b extended from the second driving voltage supply line 171, an active layer 114b overlapped with a gate electrode 108b having the gate insulating film 144 therebetween, a source electrode 110b electrically connected to the active layer 114b and connected to the first driving voltage supply line 152, and a drain electrode 112b opposite to the source electrode 110b. The drain electrode 112b of the sensor TFT 140 may be formed in a "U" shape to allow for a wider channel area for receiving light.

Also, the sensor TFT 140 includes a third contact hole 115c passing through the protective film 150 and the gate insulating film 144 to expose part of the first driving voltage supply line 152 and a fourth contact hole 115d passing through the protective film 150 to expose the source electrode 110b, and may include a first transparent electrode 155 contacted, via the third contact hole 115c, with the source electrode 110b and contacted, via the fourth contact hole 115d, with the first driving voltage supply line 152. The first transparent electrode 155 electrically connects the source electrode 110b to the first driving voltage supply line 152. The active layer 114b partially overlaps with the source electrode 110b and the drain electrode 112b, and further includes a channel portion between the source electrode 110b and the drain electrode 112b. An ohmic contact layer 148b for making an ohmic contact with the source electrode 110b and the drain electrode 112b is further formed on the active layer 114b. The sensor TFT 140 senses light transmitted by a designated image such as a document or a fingerprint, etc.

The second storage capacitor 180 may further include a plurality of storage capacitors. A second-one storage capacitor 180a substantially includes a second storage electrode 182 and the second driving voltage supply line 171 substantially overlapped with each other having the gate insulating film 144 therebetween, a second-two storage capacitor 180b substantially includes the second storage electrode 182 and the first driving voltage supply line 152 overlapped with each other having the gate insulating film 144 therebetween, and a second-third storage capacitor 180c includes the second storage electrode 182 and the second transparent electrode 156 substantially overlapped with each other having the protective film 150 therebetween. Herein, the second storage electrode 182 is connected to the source electrode 110c of the second TFT 170 and the drain electrode 112b of the sensor TFT 140, and the second transparent electrode pattern 156 is contacted, via a fifth contact hole 115e passing through the gate insulating film 144 and the protective film 150, with the second driving voltage supply line 171.

The second storage capacitor 180 stores an electric charge by a photo current generated at the photo TFT 140.

The second TFT 170 includes a gate electrode 108c substantially included in gate line 102, the source electrode 110c connected to the second storage electrode 182, the drain electrode 112c opposite the source electrode 110c, and an active layer 114c overlapped with the gate electrode 108c and forming a channel between the source electrode 110c and the drain electrode 112c. The gate electrode 108c of the second TFT 170 is different from the gate electrode 108a of the first TFT 106. In other words, the gate electrode 108a of the first TFT 106 substantially protrudes into the gate line 102 while the gate electrode 108c of the second TFT 170 slightly covers the gate line 102. The active layer 114c is formed in such a manner to partially overlap with the source electrode 110c and the drain electrode 112c, and further includes a channel portion between the source electrode 110c and the drain electrode 112c. An ohmic contact layer 148c for ohmic contact with the source electrode 110c the drain electrode 112c is further formed on the active layer 114c.

Figure 6:
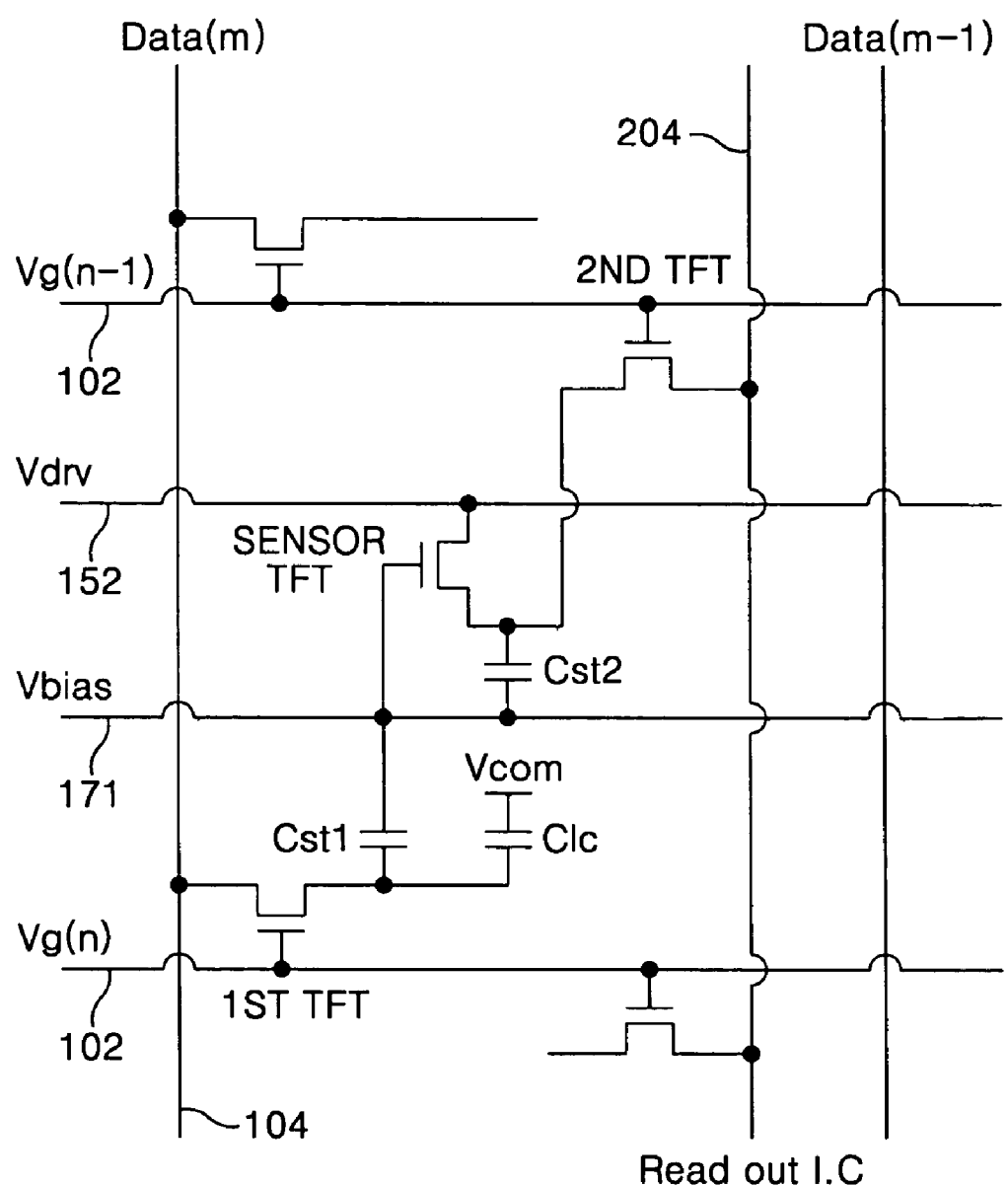
FIG. 6 is a circuit diagram schematically showing one pixel shown in FIG. 4.

A driving process of the liquid crystal display device having the above structure will be described with reference to FIG. 6.

First, a first driving voltage Vdrv is applied to the source electrode 110b of the sensor TFT 140, and a second driving voltage Vbias is applied to the gate electrode 108b of the sensor TFT 140. When light is sensed by the active layer 114b of the sensor TFT 140, a photo current path flowing into the drain electrode 112b via a channel in the source electrode 110b of the sensor TFT 140 is generated. The photo current path flows from the drain electrode 112b of the sensor TFT 140 into the second storage electrode 182. Accordingly, an electric charge generated by the photo current is charged into the second storage capacitor 180 including the second-one storage capacitor 180a by the second driving voltage supply line 171 and the second storage electrode 182, the second-two storage capacitor 180b by the first driving voltage supply line 152 and the second storage electrode 182, and the second-third storage capacitor 180c by the second transparent electrode 156 and the second storage electrode 182. As a result, the electric charge charged into the second storage capacitor 180 flows in a Read Out IC via the second TFT 170 and the Read Out Line 204.

In other words, a signal extracted from the Read Out IC according to light sensed in the sensor TFT 140 is distinguished to sense an image such as a document, an image scan and a touch-inputting. The sensed image is transmitted into a controller and may be adjusted by the liquid crystal display device users. On the other hand, the thin film transistor array substrate and the color filter array substrate, opposite the thin film transistor array substrate shown in FIG. 4 and FIG. 5, are joined together to form the liquid crystal display device having image sensing capability of the present invention.

Figure 7:
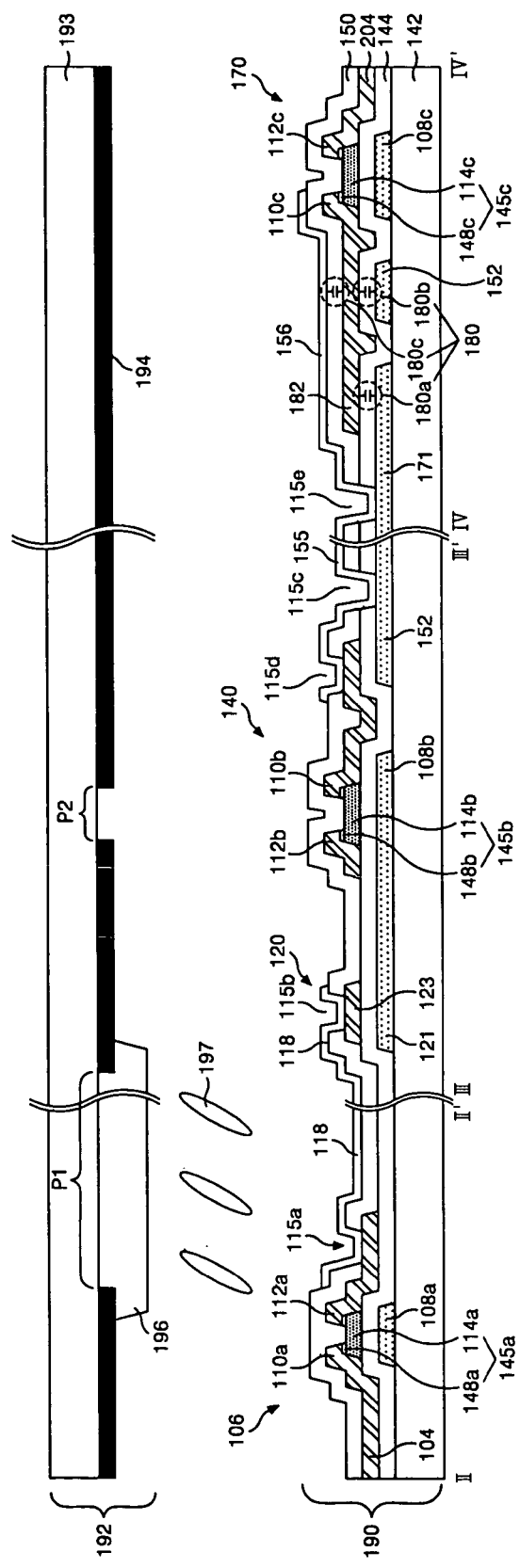
FIG. 7 is a sectional view showing a liquid crystal display device according to the present invention.

In other words, referring to FIG. 7, after a color filter array substrate 192 including a black matrix 194 for segmenting a cell area and for preventing light leakage and a color filter 196 formed at the cell area segmented by the black matrix 194, are all separately formed on an upper substrate 193, then the color filter array substrate 192 and a thin film transistor array substrate 190 are joined with each other having a liquid crystal 197 therebetween to provide the liquid crystal display device for image sensing.

On the other hand, a light receiving area P2 is provided at an area substantially corresponding to the sensor TFT 140 in the black matrix 194 of the color filter array substrate 192 shown in FIG. 7. By not positioning the black matrix 194 in the light receiving area P2, the light receiving area P2 allows reflected light from a document and an image to be radiated into the sensor TFT 140 after the light is emitted from a light source such as a backlight. Hereinafter, a method of fabricating the liquid crystal display device having image sensing capability according to the present invention will be described in detail with reference to FIG. 8A to FIG. 8E.

Firstly, a gate metal layer 108a is formed on the lower substrate 142 by a deposition technique such as, for example, sputtering. Then, the gate metal layer 108a is patterned by photolithography or other etching process to form gate patterns including the gate electrode 108a of the first TFT 106, the gate electrode 108c of the second TFT 170, the first driving voltage supply line 152, the second driving voltage supply line 171, the gate electrode 108b of the sensor TFT 140 extended from the second driving voltage supply line 171, the first lower storage electrode 121, and the gate line (not shown) as shown in FIG. 8A. Herein, the second driving voltage supply line 171 is substantially integral to the first lower storage electrode 121 of the first storage capacitor 180 and the gate electrode 108b of the sensor TFT 140.

The gate insulating film 144 (of FIG. 8B) is formed on the lower substrate 142 by a deposition technique such as the PECVD or sputtering, for example. An amorphous silicon layer and an n+ amorphous silicon layer are sequentially provided on the lower substrate 142 provided with the gate insulating film 144.

Next, the amorphous silicon layer and the n+ amorphous silicon layer are patterned by photolithography or other etching process using a mask to form semiconductor patterns 145a, 145b and 145c corresponding to the first and second TFT 106 and 170 and the sensor TFTs 140, respectively as shown in FIG. 8B. Herein, the semiconductor patterns 145a, 145b and 145c are formed from a double-layer of active layers 114a, 114b and 114c, and ohmic contact layers 148a, 148b and 148c.

The source/drain metal layer is sequentially provided on the lower substrate 142 provided with the semiconductor patterns 145a, 145b and 145c. Then, source/drain patterns including the first upper storage electrode 123 overlapped with the first lower storage electrode 121, and the second storage electrode 182 connected to the drain electrode 112b of the sensor TFT 140 is formed by using photolithography or other etching process using a mask having the data line 104, the source electrode 110a of the first TFT 106 and the drain electrode 112a, the source electrode 110c of the second TFT 170 and the drain electrode 112c, the source electrode 110b of the sensor TFT 140 and the drain electrode 112b, and the gate insulating film 144 therebetween as shown in FIG. 8C.

Figure 8D:
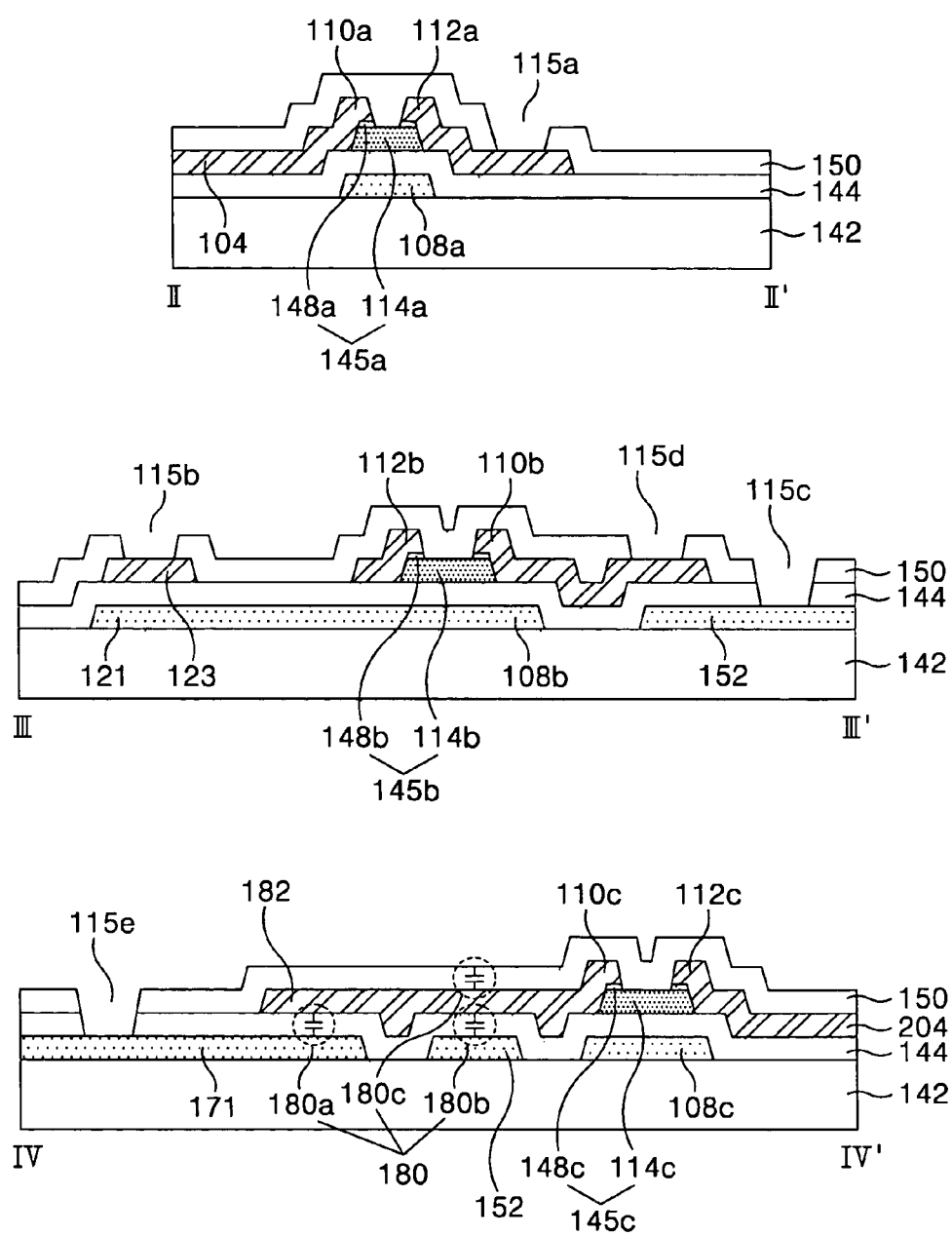

And then, the protective film 150 may be entirely formed on the gate insulating film 144 provided with the source/drain patterned by a deposition technique such as PECVD, or other technique, and patterned by photolithography or other etching process to form a first contact hole 115a for exposing the drain electrode 112a of the first TFT 106, a second contact hole 115b for exposing the first upper storage electrode 123, a third contact hole 115c for exposing the first driving voltage supply line 152, a fourth contact hole 115d for exposing the source electrode 110b of the sensor TFT 140, and a fifth contact hole 115e for exposing the second driving voltage supply line 171 of the second storage capacitor 180 as shown in FIG. 8D.

Figure 8E:
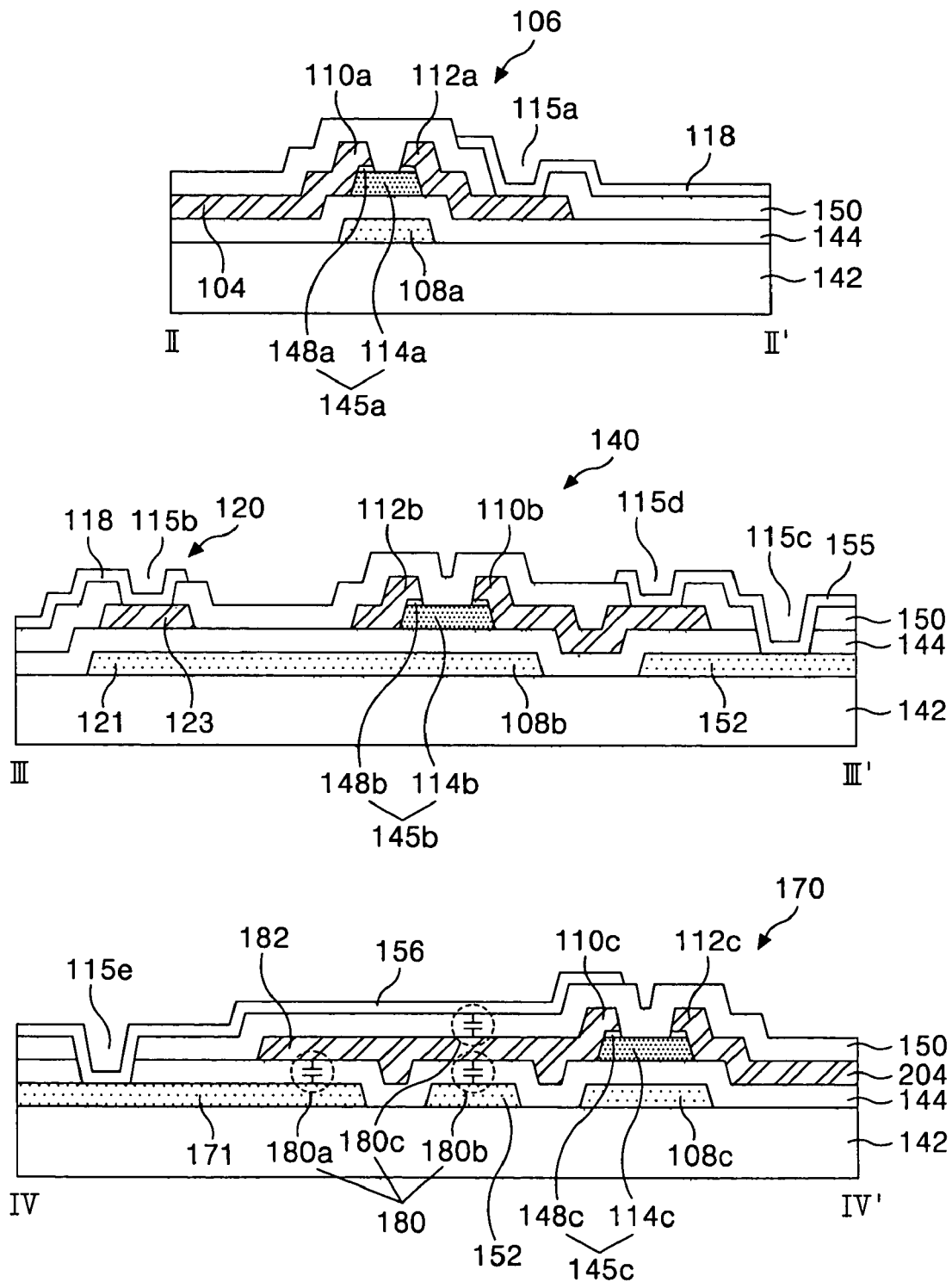

The transparent electrode material may be entirely disposed on the protective film 150. Then, the transparent electrode material may be patterned by photolithography or other etching process to form the pixel electrode 118, a first transparent electrode pattern 155 and a second transparent electrode pattern 156 as shown in FIG. 8E.

The pixel electrode 118 is contacted, via the first contact hole 115a, with the drain electrode 112a of the first TFT 106, and is contacted, via the second contact hole 115b, with the first upper storage electrode 123.

The first transparent electrode pattern 155 is contacted, via the third contact hole 115c, with the first driving voltage supply line 152, and is contacted, via the fourth contact hole 115d, with the source electrode 110b of the sensor TFT 140.

The second transparent electrode pattern 156 is overlapped with one portion of the second storage electrode 182, and is contacted, via the fifth contact hole 115e, with the second driving voltage supply line 171.

Next, the color filter array substrate 192 including the black matrix 194 for segmenting the cell area and for preventing light leakage, and the color filter 196 formed at the cell area segmented by the black matrix 194, for example is formed on the upper substrate 193 by a separate process. The black matrix 194 masks the second TFT 170 and opens the light receiving area P2 corresponding to the pixel area P1, the sensor TFT 140, and the color filter 196 corresponding to the pixel area including the pixel electrode 118. Herein, the common electrode, an alignment film, a spacer and an over-coat layer may be selectively further formed on the color filter array substrate 192.

Next, the thin film transistor array substrate 190 and the color filter array substrate 192 are joined by a joining process and include a layer of liquid crystal 197 therebetween to form the liquid crystal display device as shown in FIG. 7.

Figure 9:
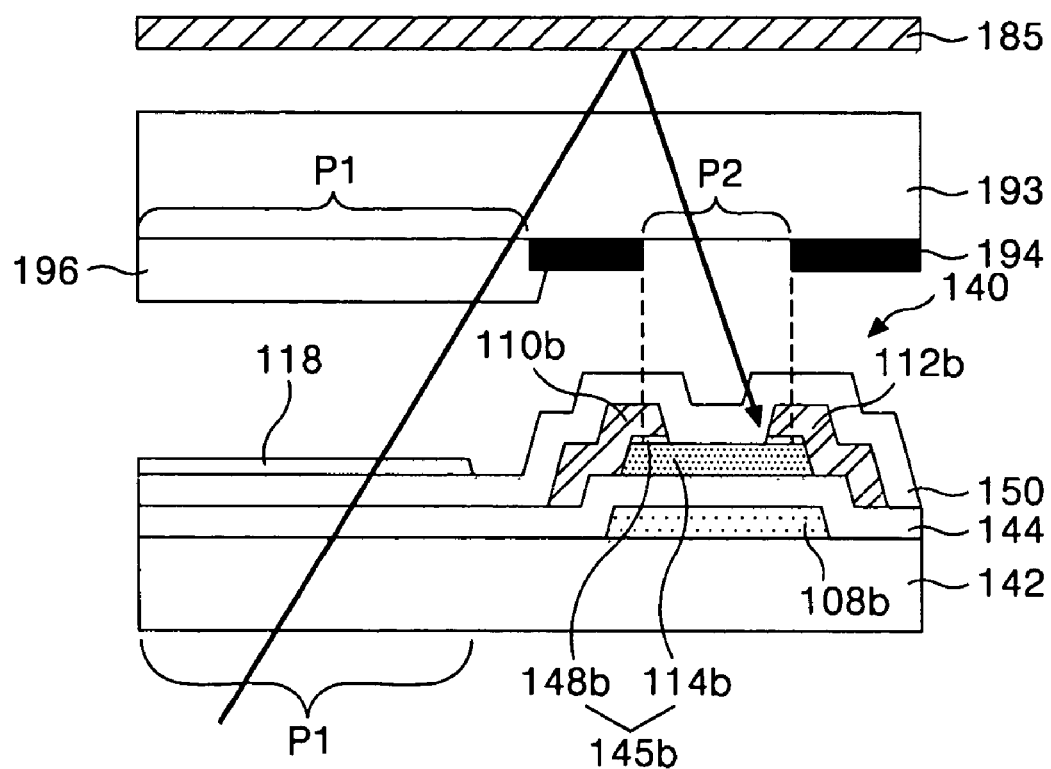
FIG. 9 shows a way in which the sensor thin film transistor of the liquid crystal display device senses light.
Figure 10:
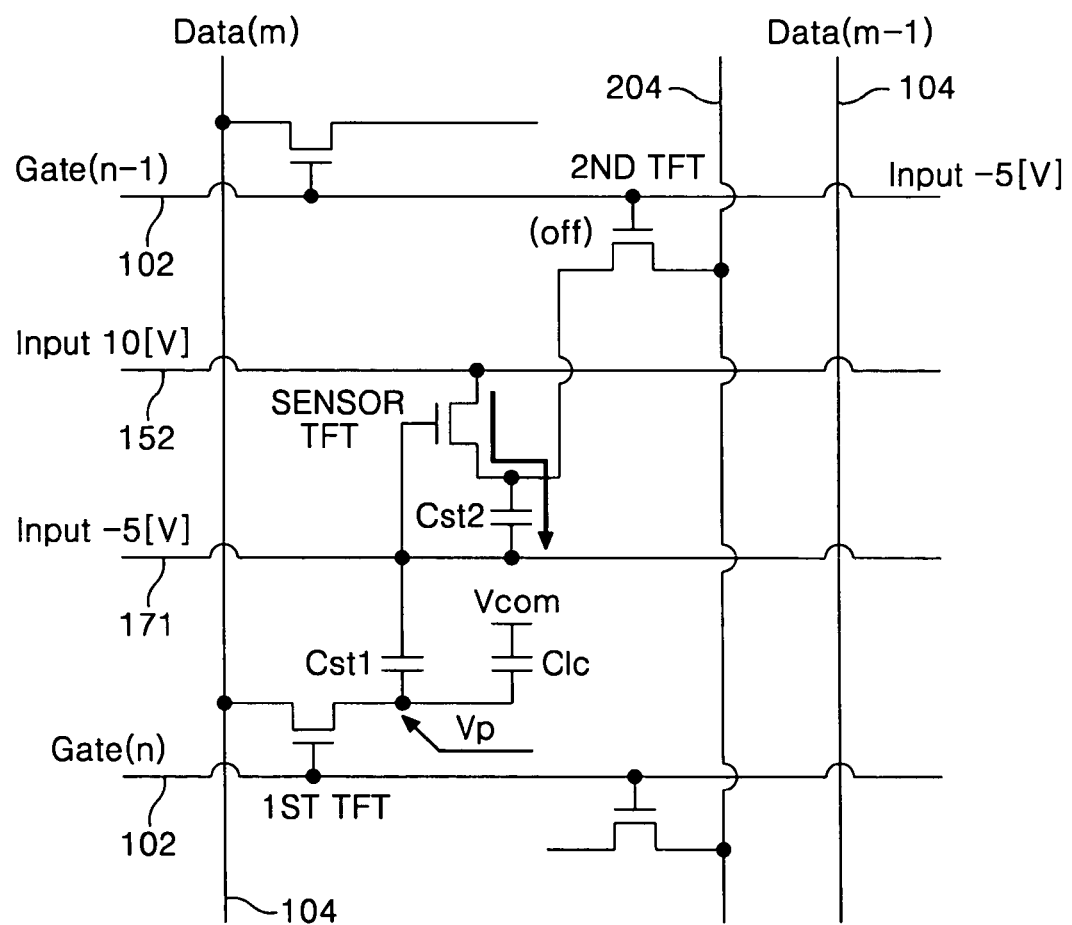
FIG. 10 and FIG. 11 are circuit diagrams for explaining a photo sensing process according to the present invention.
Figure 11:
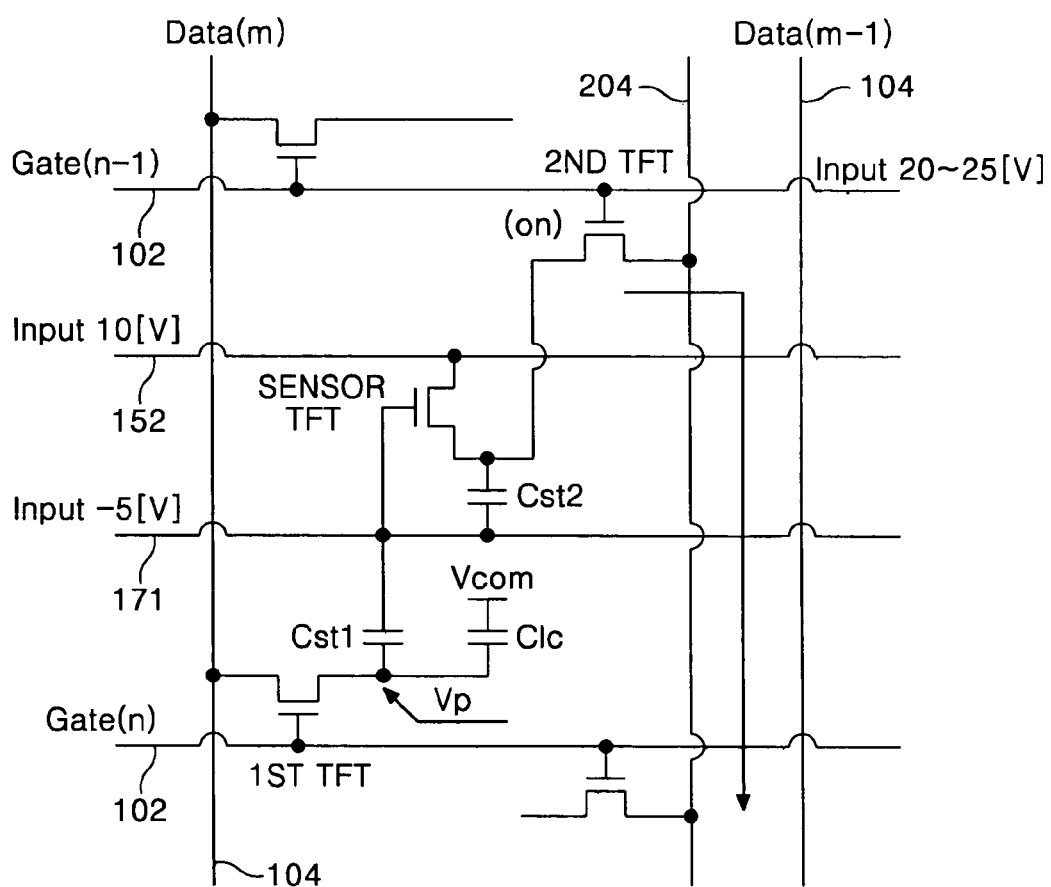

FIG. 9 is a sectional view showing how the liquid crystal display device senses an image, FIG. 10 is a circuit diagram showing a process by which external light is transmitted into the sensor TFT and sensed, and FIG. 11 is a circuit diagram showing a process in which the sensed signal is extracted from the Read Out Integrated Circuit IC.

First, referring to FIG. 9, the liquid crystal display device includes the color filter array substrate opposed to the TFT array substrate provided with the sensor TFT 140 and having the liquid crystal layer positioned therebetween. A printed matter 185 (document, picture, for example) is positioned on an upper portion of the color filter array substrate. For convenience, the sensor TFT 140 sensing light is primarily shown in FIG. 9.

Referring to FIG. 10, in the liquid crystal display device, for example, approximately 10V of a driving voltage is applied to the source electrode 110b of the sensor TFT 140 from the first driving voltage supply line 152, and approximately −5V of an inverse bias voltage is applied to the gate electrode 108b of the sensor TFT 140 from the second driving voltage supply line 171. When light (for example, the external light) is sensed by the active layer 114b of the sensor TFT 140, a photo current path flowing into the drain electrode 112b via a channel of the active layer 114b from the source electrode 110b of the sensor TFT 140 is generated as shown in FIG. 9. The photo current path flows from the drain electrode 112b of the sensor TFT 140 into the second storage electrode 182. Accordingly, an electric charge generated by the photo current is charged into the second storage capacitor 180 including the second-one storage capacitor 180a, the second-two storage capacitor 180b, and the second-third storage capacitor 180c. Herein, a voltage difference of approximately 15V between the source electrode 110b of the sensor TFT 140 and the second driving voltage supply line 171 is charged into the second storage capacitor 180.

As described above, a gate low voltage, for example −5V, is applied to the gate electrode 108c of the second TFT 170 for the sensor TFT 140 to sense light and an electric charge is charged into the second storage capacitor 180, so that the second TFT 170 maintains a turn-off state.

Next, referring to FIG. 11, the second TFT 170 supplying a high voltage, for example, approximately 20-25V to the gate electrode 108c of the second TFT 170 is turned-on, and a current path of an electric charge charged into the second storage capacitor 180 is supplied to the Read Out Integrated Circuit IC via the source electrode 110c of the second TFT 170, a channel of the active layer 114c, the drain electrode 112c and the Read Out Line 204. The sensing signal by the supplied current path is formed in the Read Out Integrated Circuit IC.

As described above, the liquid crystal display device having image sensing capability according to the present invention has the display function for displaying a picture as well as an image sensing capability to input an external document and touch capability, as well as a function for outputting the inputted image based upon user preference.

Figure 12:
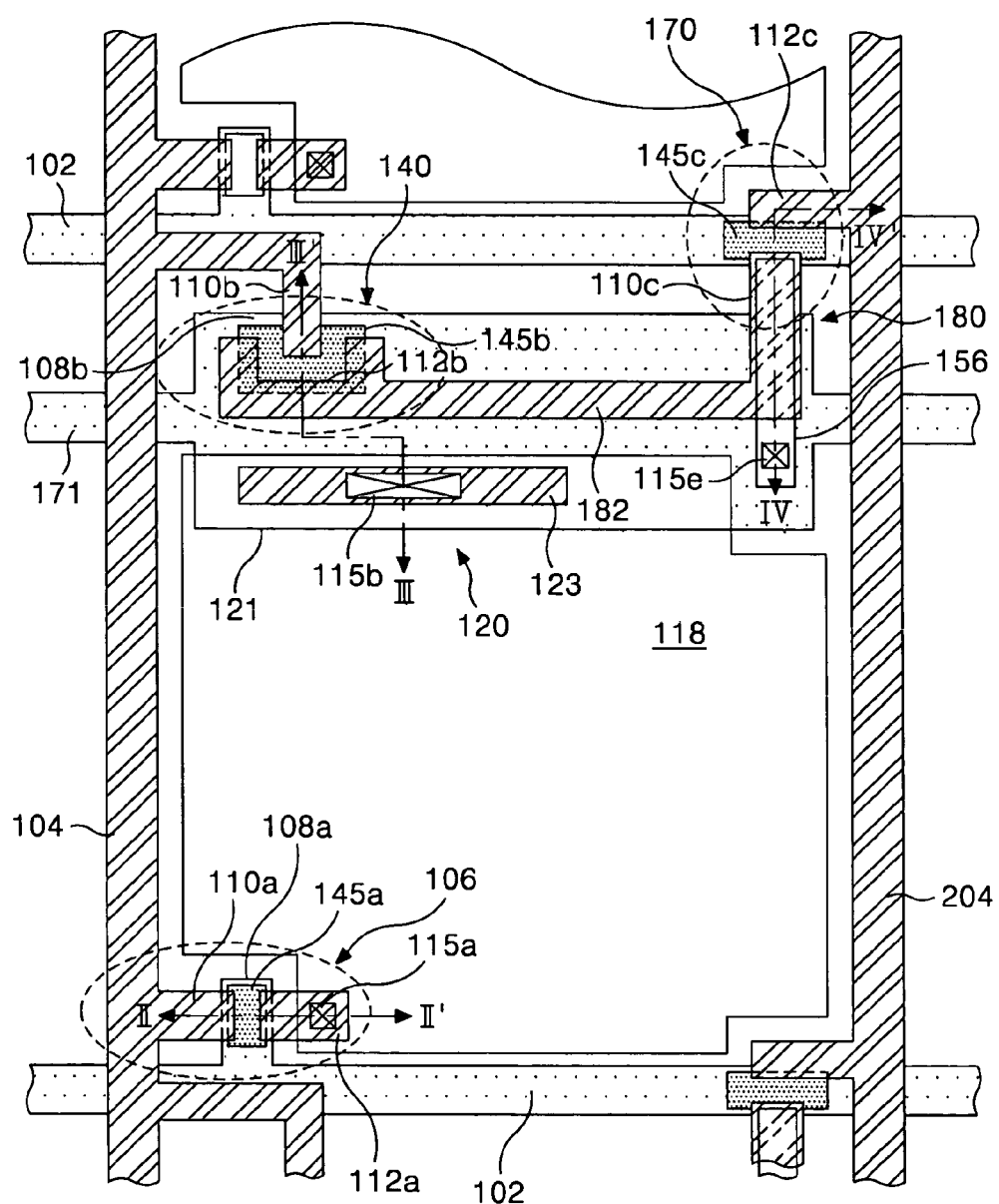
FIG. 12 is a plan view showing a thin film transistor array substrate of a liquid crystal display device having image sensing capability according to an embodiment of the present invention.
Figure 13:
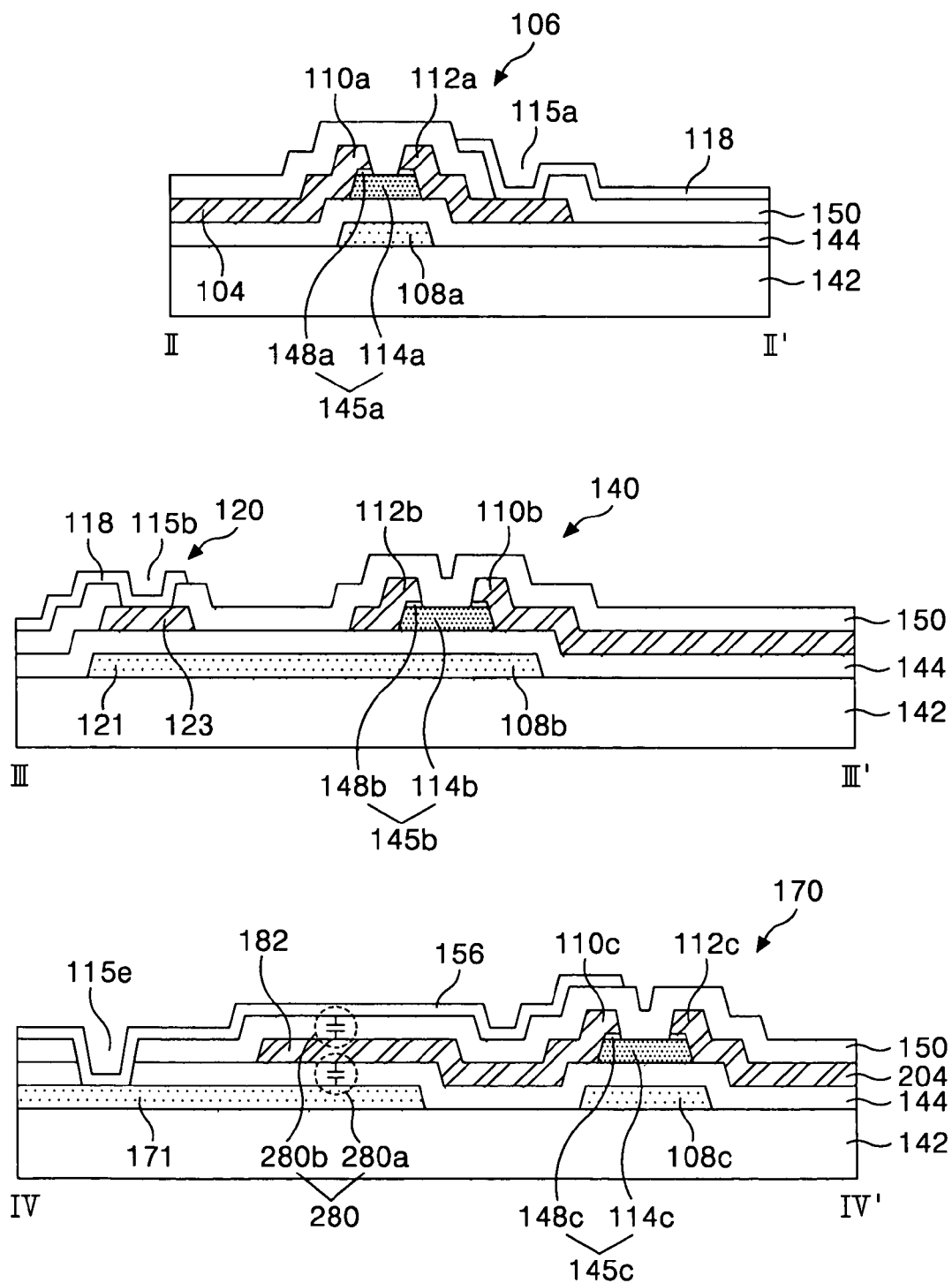
FIG. 13 is a sectional view of the thin film transistor array substrate taken along the lines II-II', III-III', IV-IV' in FIG. 12.
Figure 14:
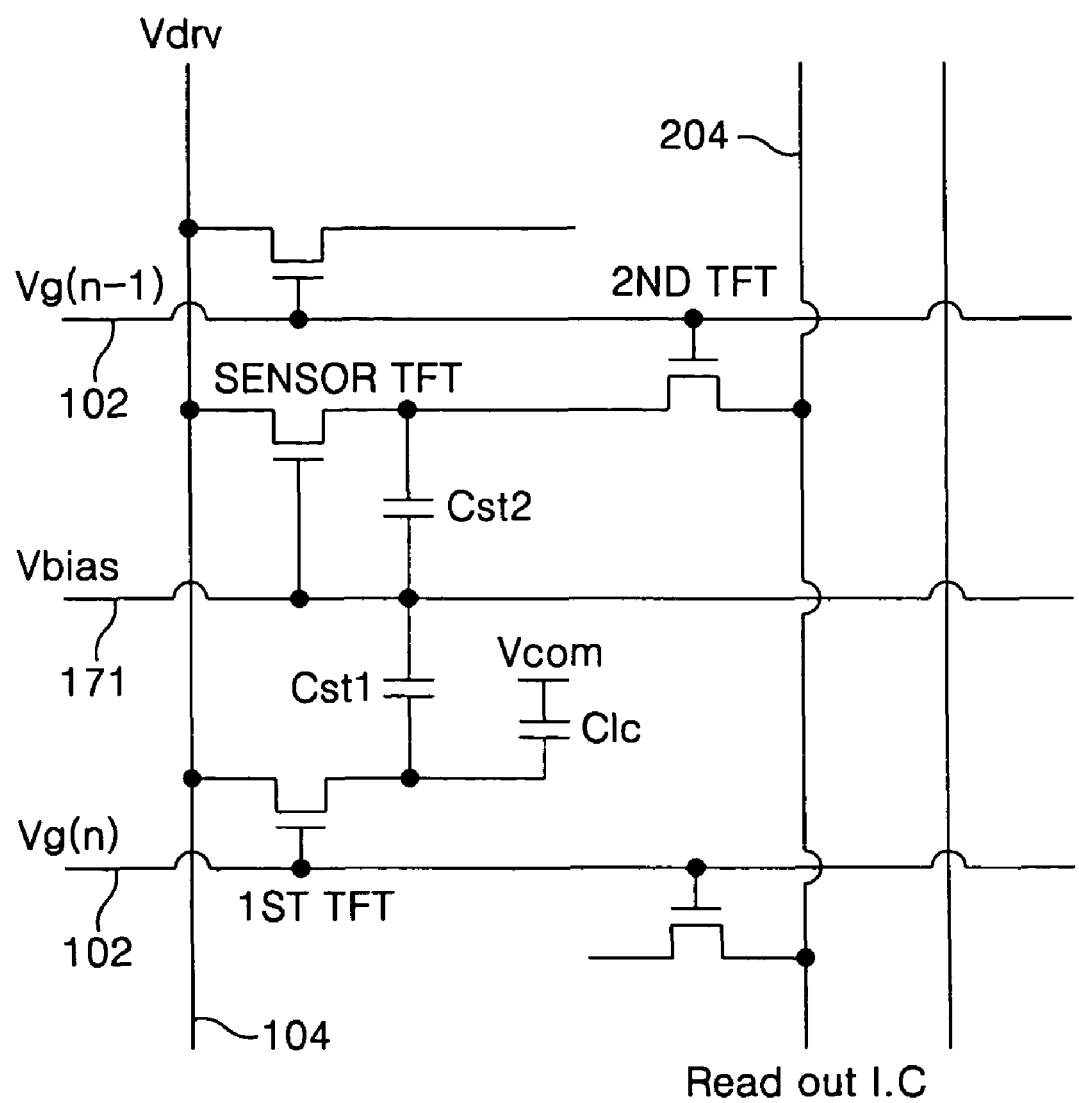
FIG. 14 is a circuit diagram schematically showing one pixel shown in FIG. 12.

FIG. 12 is a plan view showing a thin film transistor array substrate of a liquid crystal display device having image sensing capability according to an embodiment of the present invention, and FIG. 13 is a sectional view of the thin film transistor array substrate taken along the lines II-II', III-III', IV-IV' of FIG. 12.

In the thin film transistor array substrate shown in FIG. 12 and FIG. 13, a first driving voltage of the sensor TFT 140 is supplied from the data line 104, instead of the first driving voltage supply line 152 in contrast to the thin film transistor array substrate shown in FIG. 4 and FIG. 5.

Hereinafter, the same elements of another embodiment of the present invention are given the same reference numerals as the previous embodiment of the present invention. Further, an explanation of the same elements will be omitted.

Referring to FIG. 12 and FIG. 13, the thin film transistor array substrate includes a gate line 102 and a data line 104 provided on the lower substrate 142 to intersect each other with the gate insulating film 144 therebetween, the first TFT 106 provided at each intersection, and the pixel electrode 118 provided at a cell area, the Read Out Line 204 formed in parallel to the data line 104 with the pixel electrode 118 therebetween, the second driving voltage supply line 171 formed in parallel to the gate line 102, the sensor TFT 140 positioned between the second driving voltage supply line 171 and the gate line 102, and supplied with the second driving voltage from the second driving voltage supply line 171 and supplied with the first driving voltage from the data line 104, the second TFT 170 formed at an intersection area of the gate line 102 and the Read Out Line 204, the first storage capacitor 120 formed at an area substantially overlapped with the second driving voltage supply line 171 and the pixel electrode 118, and a second storage capacitor 180 positioned between the second TFT 170 and the sensor TFT 140.

The pixel electrode 118 is connected, via the first contact hole 115a passing through the protective film 150, to the drain electrode 112a.

Herein, the pixel electrode 118 is formed wider than the pixel electrode 118 according to the previous embodiment of the present invention. In other words, an embodiment of the present invention does not include the first driving voltage supply line 152, so that a formation area of the pixel electrode 118 is enlarged. As a result, an aperture ratio of the present embodiment as compared to the previous embodiment of the present invention can be widened. Furthermore, a path of backlight light transmitted into the sensor TFT 170 via the pixel electrode 118 is enlarged, to improve reliability of the sensor TFT 140.

The sensor TFT 140 includes a gate electrode 108b extended from the second driving voltage supply line 171, an active layer 114b overlapped with a gate electrode 108b with the gate insulating film 144 therebetween, a source electrode 110b electrically connected to the active layer 114b and extended from the data line 104, and a drain electrode 112b opposite to the source electrode 110b. Herein, the source electrode 110b of the sensor TFT 140 extended from the data line 104 differs from the source electrode 110a of the first TFT 106. In other words, in this embodiment of the present invention, the source electrode may be connected to the data line 104. Accordingly, in case of a display mode of the liquid crystal display device, a data voltage from the data line 104 is supplied to the source electrode 110a of the first TFT 106. On the other hand, in case of a sensing mode of the liquid crystal display device, the first driving voltage from the data line 104 is supplied to the source electrode 110b of the sensor TFT 140.

Also, the sensor TFT 140 is supplied with the first driving voltage from the data line 104, so that the third and fourth contact hole 115c and 115d of the previous embodiment, and the first transparent electrode 155 are not required.

The second storage capacitor 180 may include at least a plurality of storage capacitors. In other words, a second-one storage capacitor 180a includes a second storage electrode 182 and the second driving voltage supply line 171 overlapped with each other with the gate insulating film 144 therebetween, a second-two storage capacitor 180b includes the second storage electrode 182 and the second transparent electrode 156 overlapped with each other with the protective film 150 therebetween. Herein, the second storage electrode 182 is connected to the source electrode 110c of the second TFT 170 and the drain electrode 112b of the sensor TFT 140, and the second transparent electrode 156 contacted, via the fifth contact hole 115e passing through the gate insulating film 144 and the protective film 150, with the second driving voltage supply line 171.

The second storage capacitor 180 stores an electric charge generated by a photo current at the photo TFT 140. A light sensing process in the liquid crystal display device according to an embodiment of the present invention having such structure will be described in reference to a circuit diagram shown in FIG. 14.

First, a first driving voltage Vdrv from the data line 104 is applied to the source electrode 110b of the sensor TFT 140, and a second driving voltage Vbias is applied to the gate electrode 108b of the sensor TFT 140. When light is sensed by the active layer 114b of the sensor TFT 140, a photo current path is generated flowing into the drain electrode 112b via a channel in the source electrode 110b of the sensor TFT 140.

The photo current path flows from the drain electrode 112b of the sensor TFT 140 into the second storage electrode 182. Accordingly, an electric charge generated by the photo current is charged into the second storage capacitor 180 including the second-one storage capacitor 180a by the second driving voltage supply line 172 and the second storage electrode 182, the second-two storage capacitor 180b by the second transparent electrode 156 and the second storage electrode 182. As a result, the electric charge charged into the second storage capacitor 180 flows in a Read Out IC via the second TFT 170 and the Read Out Line 204.

Hereinafter, a method of fabricating the liquid crystal display device having image sensing capability according to the present invention will be described in detail with reference to FIG. 15A to FIG. 15E.

First, a gate metal layer is formed on the lower substrate 142 by a deposition technique such as, for example, sputtering. Then, the gate metal layer is patterned by photolithography or other etching process to form gate patterns including the gate electrode 108a of the first TFT 106, the gate electrode 108c of the second TFT 170, the second driving voltage supply line 171, the gate electrode 108b of the sensor TFT 140 extended from the second driving voltage supply line 171, the first lower storage electrode 121, and the gate line (not shown) as shown in FIG. 15A. Herein, the second driving voltage supply line 171 is substantially integral to the first lower storage electrode 121 of the first storage capacitor 180 and the gate electrode 108b of the sensor TFT 140.

The gate insulating film 144 is formed on the lower substrate 142 by a deposition technique such as the PECVD, or sputtering, for example. An amorphous silicon layer and an n+ amorphous silicon layer are sequentially provided on the lower substrate 142 provided with the gate insulating pattern 144.

Next, the amorphous silicon layer and the n+ amorphous silicon layer are patterned by photolithography or other etching process using a mask to form semiconductor patterns 145a, 145b and 145c corresponding to the first and second TFT 106 and 170 and the sensor TFTs 140, respectively as shown in FIG. 15B. Herein, the semiconductor patterns 145a, 145b and 145c are formed from a double-layer of active layers 114a, 114b and 114c, and ohmic contact layers 148a, 148b and 148c.

The source/drain metal layer is sequentially provided on the lower substrate 142 provided with the semiconductor patterns 145a, 145b and 145c. Then, source/drain patterns including the first upper storage electrode 123 overlapped with the first lower storage electrode 121, and the second storage electrode 182 connected to the drain electrode 112b of the sensor TFT 140 is formed by using photolithography or other etching process using a mask with the data line 104, the source electrode 110a of the first TFT 106 and the drain electrode 112a, the source electrode 110c of the second TFT 170 and the drain electrode 112c, the source electrode 110b of the sensor TFT 140 and the drain electrode 112b, and the gate insulating film 144 therebetween as shown in FIG. 15C. Herein, the source electrode 110a of the first TFT 106 and the source electrode 110b of the sensor TFT 140 are extended from the data line 104.

Figure 15D:
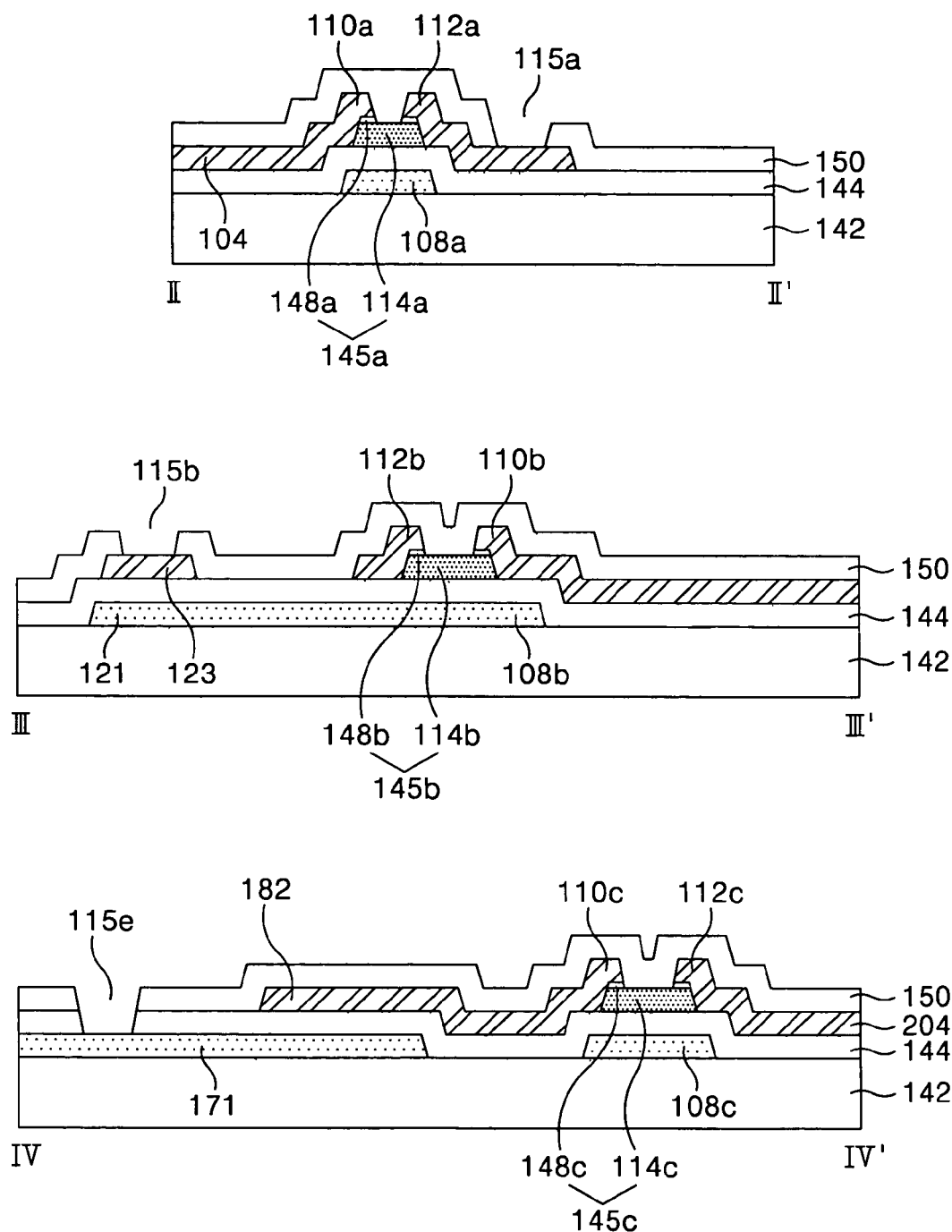

And then, the protective film 150 may be entirely formed on the gate insulating film 144 with the source/drain patterned by a deposition technique such as PECVD, for example, and patterned by photolithography or other etching process to form a first contact hole 115a for exposing the drain electrode 112a of the first TFT 106, a second contact hole 115b for exposing the first upper storage electrode 123, and a fifth contact hole 115e for exposing the second driving voltage supply line 171 of the second storage capacitor 180 as shown in FIG. 15D.

Figure 15E:
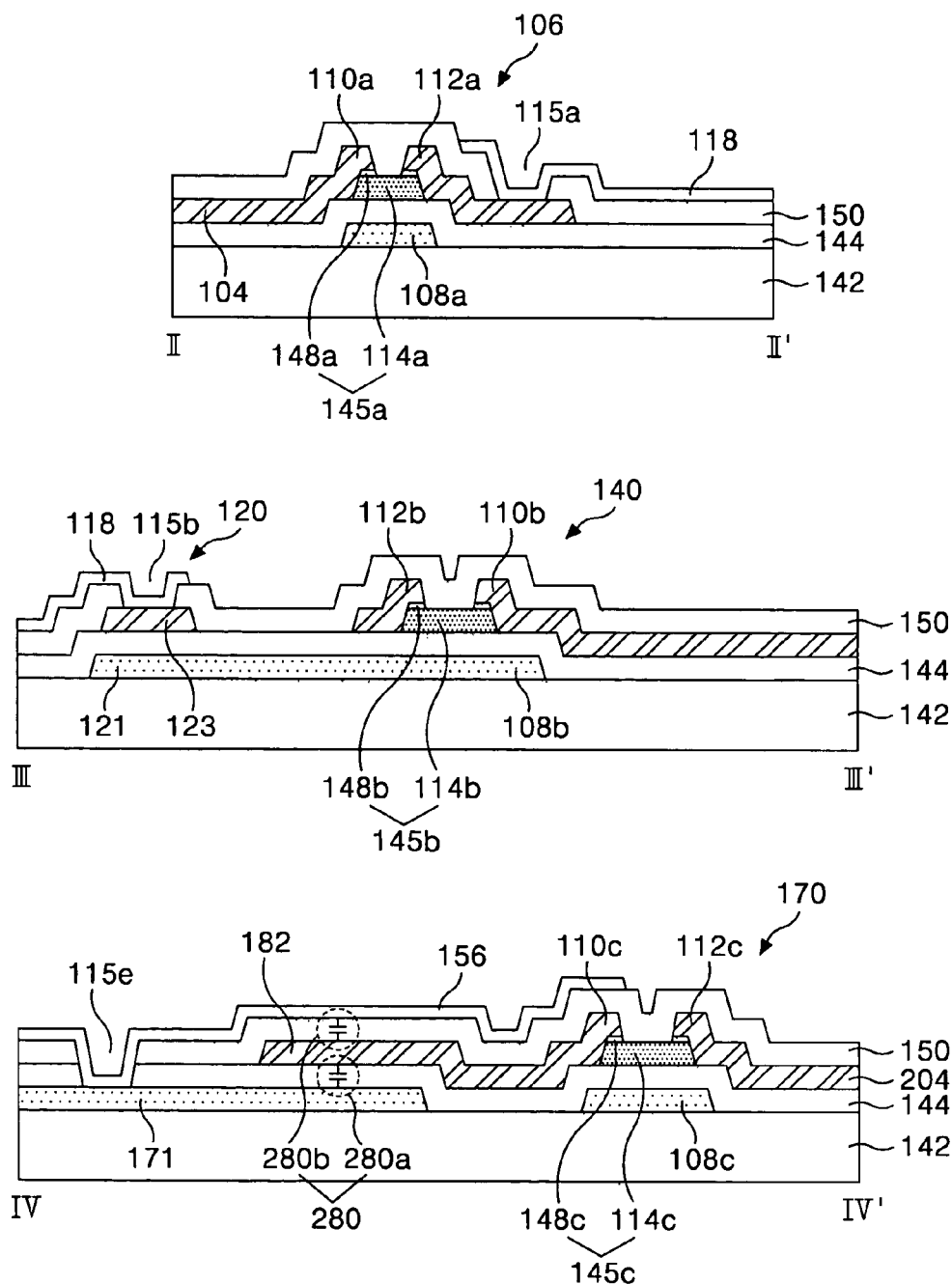

The transparent electrode material may be entirely disposed on the protective film 150. Then, the transparent electrode material is patterned by photolithography or other etching process to form the pixel electrode 118 and a second transparent electrode 156 as shown in FIG. 15E.

The pixel electrode 118 is contacted, via the first contact hole 115a, with the drain electrode 112a of the first TFT 106, and is contacted, via the second contact hole 115b, with the first upper storage electrode 123.

The second transparent electrode pattern 156 is overlapped with one portion of the second storage electrode 182, and is contacted, via the fifth contact hole 115e, with the second driving voltage supply line 171.

As described above, the liquid crystal display device and the fabricating method thereof according to an embodiment of the present invention similar to the previous embodiment of the present invention senses an image such as a document, an image scanning and a touch-inputting, etc.

On the other hand, the liquid crystal display device and the fabricating method thereof according to another embodiment of the present invention have more advantages when compared to the previous embodiment since the first driving voltage supply line 152 in the previous embodiment of the present invention has a different structure.

The driving voltage supply line 152 may be removed to secure a distance between lines in comparison to a structure including the gate line 102 and the first and second driving voltage supply line 152 and 171. As a result, the probability of an electrical short between the lines is sharply reduced.

Also, an area of the pixel electrode 118 can be enlarged. As a result, aperture ratio is increased. Furthermore, a path of a backlight light to be transmitted into the sensor TFT 170 via the pixel electrode 118 is wider, so that it becomes possible to improve reliability of the sensor TFT 170.

Lastly, parasitic capacitance between the Read Out Line 204 and other lines can be reduced. Thus, a signal sensing ability sensed by the sensor TFT 140 is improved, thus improving sensing reliability.

The above will be described in detail with reference to FIG. 16.

Figure 16:
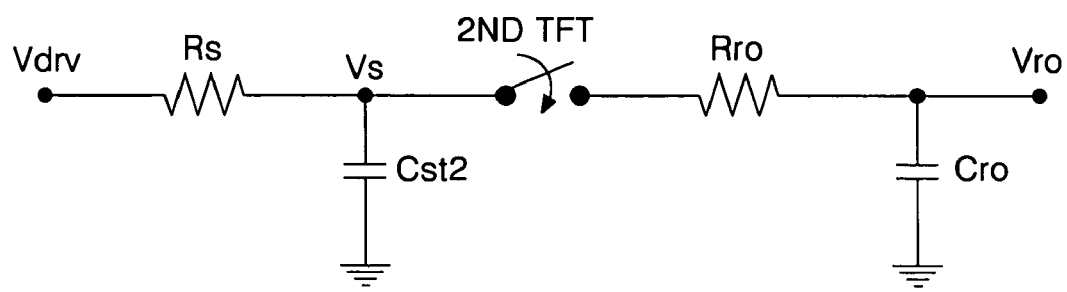
FIG. 16 is a diagram showing how the sensed voltage is transmitted by a read-out integrated circuit.

FIG. 16 is a diagram that shows how sensed voltage is transmitted by a read-out integrated circuit.

Initially, light having a designated image is sensed in the sensor TFT 140 and an electric charge generated by a photo current is charged into the second storage capacitor 180.

Herein, Rs represents a whole resistance value between the second storage capacitor 280 in a first driving voltage source. For example, Rs is a total sum such as a resistance value within the sensor TFT 140 and the electrode. Vs represents a storage voltage Vs of the second storage capacitor 1800.

Next, the second TFT 170 is turned-on, and a current path by an electric charge charged into the second storage capacitor 180 is supplied to the Read Out Integrated Circuit IC via the source electrode 110c of the second TFT 170, a channel of the active layer 114c, the drain electrode 112c and the Read Out Line 204. Herein, Rro represents a whole resistance value from the second storage capacitor 180 to the Read Out Integrated Circuit IC.

Herein, a sensing voltage Vro sensed in the Read Out Integrated Circuit IC will be described in equation. (1)

$$Vro=Cst2/(Cst2+Cro)*Vs \qquad (1)$$

Wherein, Cro represents a parasitic capacitor formed at an intersection area between the first driving voltage supply line 152 and the Read Out Line 204 in an embodiment.

Referring to equation (1), a voltage Vro sensed by the Read Out Integrated Circuit IC and the second storage voltage Vs stored in the second storage capacitor 180 are differentiated by the parasitic capacitor.

Accordingly, in this embodiment of the present invention, the second driving voltage supply line 152 is removed to sharply reduce a Cro value, so that the second storage voltage Vs and the voltage Vro sensed by the Read Out Integrated Circuit IC is almost the same. As a result, sensor capability is more precise in contrast to the previous embodiment, so that reliability of the sensor is improved.

Lastly, the sensor TFT 140 may employ a data voltage supplied to the data line 104 as a first driving voltage. Accordingly, in case of display mode, the liquid crystal display device may sense an image desired by users during display according to the requirement of the users.

As described above, a liquid crystal display device and a fabricating method thereof having image sensing capability, and a method of sensing an image by using the liquid crystal display device and the fabricating method thereof includes a sensing device for sensing a document or an image, for example, and a liquid crystal display device that is adaptive for displaying a picture, so that an image is inputted by using one liquid crystal display device and the inputted image can be displayed on a picture. Particularly, an image sensing function is added to the liquid crystal display device, so that it becomes possible to input or output an image into the liquid crystal display device. Thus, the present invention reduces both cost and display bulkiness.

Although the present invention has been explained by the embodiments shown in the drawings and specification described above, it will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   a thin film transistor array substrate;
   a color filter array substrate;
   a liquid crystal which is provided between the thin film transistor array substrate and the color filter array substrate,
   a first storage capacitor for storing a pixel voltage charged into the pixel electrode;
   a second storage capacitor for storing a signal sensed by the sensor thin film transistor;
   an integrated circuit for extracting the sensing signal stored in the second storage capacitor;
   a second thin film transistor connected to the second storage capacitor and the pre-stage gate line, and for selectively supplying the sensing signal to the integrated circuit; and
   a sensing signal transmitting line substantially parallel to the data line with having the pixel area therebetween, and for transmitting a sensing signal from the second thin film transistor into the integrated circuit,
   wherein the thin film transistor array substrate including a gate line and a data line crossing each other on a substrate to define a pixel area in which a pixel electrode is positioned; a first thin film transistor at an intersection area of the gate line and the data line; a sensor thin film transistor that senses light having image information and supplied with a first driving voltage from the data line; and a driving voltage supply line substantially in parallel to the gate line to supply a second driving voltage to the sensor thin film transistor,
   wherein the color filter array substrate including a black matrix for segmenting the pixel area and for preventing light leakage; a color filter formed at the cell area segmented by the black matrix,
   wherein a light receiving area is provided at an area corresponding to the sensor thin film transistor in the black matrix of the color filter array substrate.

2. The liquid crystal display device as claimed in claim 1, wherein said sensor thin film transistor comprises:
   a first gate electrode extended from the driving voltage supply line;
   a gate insulating film formed in to cover the first gate electrode;
   a first semiconductor pattern overlapped with the first gate electrode with the gate insulating film therebetween;
   a first source electrode contacted with the first semiconductor pattern, and connected to the data line; and
   a first drain electrode opposite the first source electrode.

3. The liquid crystal display device as claimed in claim 1, wherein said first storage capacitor comprises:
   a first lower storage electrode extended from the driving voltage supply line; and
   a first upper storage electrode overlapped with the first lower storage electrode with the gate insulating film therebetween,
   wherein the first upper storage electrode is contacted, via a first hole passing through a protective film, with the pixel electrode.

4. The liquid crystal display device as claimed in claim 1, wherein said first thin film transistor comprises:
   a third gate electrode extended from the gate line; a third semiconductor pattern formed in such a manner to overlap with the third gate electrode with the gate insulating film therebetween;
   a third source electrode electrically connected to the third semiconductor pattern, and extended from the data line; and
   a third drain electrode opposite to the third source electrode, and connected to the pixel electrode.

5. The liquid crystal display device as claimed in claim 2, wherein said first drain electrode is formed in a "U" shape.

6. The liquid crystal display device as claimed in claim 2, wherein said second storage capacitor comprises:

a second-one storage capacitor consisted of a second storage electrode contacted with a first drain electrode of the sensor thin film transistor and the second thin film transistor, and the driving voltage supply line overlapped with the second storage electrode with the gate insulating film therebetween; and a second-two storage capacitor overlapped with the second storage electrode with a protective film therebetween, and comprising a transparent electrode contacted, via a second hole for exposing the driving voltage supply line, with the driving voltage supply line.

7. The liquid crystal display device as claimed in claim 2, wherein said second thin film transistor comprises:

a second gate electrode contacted with the pre-stage gate line;

a second semiconductor pattern overlapped with the second gate electrode with the gate insulating film therebetween;

a second source electrode electrically connected to the second semiconductor pattern, and extended from the second storage electrode; and a second drain electrode opposite to the second source electrode, and connected to the sensing signal transmitting line.

* * * * *